United States Patent
He et al.

(10) Patent No.: US 11,756,922 B2
(45) Date of Patent: Sep. 12, 2023

(54) HYBRID BONDING STRUCTURE AND HYBRID BONDING METHOD

(71) Applicant: HUAWEI TECHNOLOGIES CO., LTD., Guangdong (CN)

(72) Inventors: Ran He, Shenzhen (CN); Huifang Jiao, Shenzhen (CN); Yufeng Dai, Dongguan (CN); Guanglin Yang, Dongguan (CN); Chihon Ho, Shanghai (CN); Ronghua Xie, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 122 days.

(21) Appl. No.: 17/525,964

(22) Filed: Nov. 15, 2021

(65) Prior Publication Data
US 2022/0077105 A1    Mar. 10, 2022

Related U.S. Application Data

(63) Continuation of application No. PCT/CN2019/087006, filed on May 15, 2019.

(51) Int. Cl.
*H01L 23/48* (2006.01)
*H01L 23/52* (2006.01)
*H01L 23/00* (2006.01)

(52) U.S. Cl.
CPC .............. *H01L 24/80* (2013.01); *H01L 24/08* (2013.01); *H01L 2224/0801* (2013.01);
(Continued)

(58) Field of Classification Search
CPC combination set(s) only.
See application file for complete search history.

(56) References Cited

U.S. PATENT DOCUMENTS

| 6,756,305 B1 * | 6/2004 | Conn | H01L 24/11 257/E23.021 |
|---|---|---|---|
| 2016/0155862 A1 * | 6/2016 | Hong | H01L 24/32 257/432 |

FOREIGN PATENT DOCUMENTS

| CN | 102169845 A | 8/2011 |
|---|---|---|
| CN | 102593087 A | 7/2012 |

(Continued)

OTHER PUBLICATIONS

Cheng-Ta Ko et al.,"Wafer-to-wafer hybrid bonding technology for 3D IC", 3rd Electronics System Integration Technology Conference ESTC,Sep. 13-16, 2010 ,total 5 pages.

*Primary Examiner* — Niki H Nguyen
(74) *Attorney, Agent, or Firm* — HUAWEI TECHNOLOGIES CO., LTD.

(57) ABSTRACT

Embodiments of this application disclose a hybrid bonding structure and a hybrid bonding method. The hybrid bonding structure includes a first chip and a second chip. A surface of the first chip includes a first insulation dielectric and a first metal, and a first gap area exists between the first metal and the first insulation dielectric. A surface of the second chip includes a second insulation dielectric and a second metal. A surface of the first metal is higher than a surface of the first insulation dielectric. Metallic bonding is formed after the first metal is in contact with the second metal, and the first metal is longitudinally and transversely deformed in the first gap area. Insulation dielectric bonding is formed after the first insulation dielectric is in contact with the second insulation dielectric.

20 Claims, 9 Drawing Sheets

(52) U.S. Cl.
CPC .............. *H01L 2224/08056* (2013.01); *H01L 2224/08059* (2013.01); *H01L 2224/08145* (2013.01); *H01L 2224/80047* (2013.01); *H01L 2224/80095* (2013.01); *H01L 2224/80345* (2013.01); *H01L 2224/80895* (2013.01); *H01L 2224/80896* (2013.01)

(56) References Cited

FOREIGN PATENT DOCUMENTS

| | | | |
|---|---|---|---|
| CN | 102623433 | A | 8/2012 |
| CN | 104167372 | A | 11/2014 |
| JP | 2016018879 | A | 2/2016 |
| JP | 2016021497 | A | 2/2016 |
| WO | 2018211447 | A1 | 11/2018 |

\* cited by examiner

HYBRID BONDING STRUCTURE AND HYBRID BONDING METHOD

CROSS-REFERENCE TO RELATED APPLICATIONS

This application is a continuation of International Application No. PCT/CN2019/087006, filed on May 15, 2019, the disclosure of which is hereby incorporated by reference in its entirety.

TECHNICAL FIELD

This application relates to the field of integrated circuit manufacturing, and in particular, to a hybrid bonding structure and a hybrid bonding method.

BACKGROUND

With continuous improvement of integration level, a quantity of component units on each chip increases sharply, and an area of the chip increases. An increase in a quantity of connection lines between the units affects a working speed of a circuit and occupies a large area, which seriously affects further improvement of integration level and a working speed of an integrated circuit. A three-dimensional stacking technology becomes a mainstream breakthrough solution at present. In the three-dimensional stacking technology, bonding is a core process technology of a manufacturing technology of the integrated circuit, goes through a technology iteration process from a micro bump and a Cu pillar bump (Cu pillar) to wafer bonding, and now has developed from dielectric wafer bonding to the most advanced hybrid bonding.

Currently, in a hybrid bonding process, because a metal surface depression is caused by a wafer surface polishing process, a sufficiently high temperature (for example, 300° C. to 400° C.) needs to be provided to make metals expand to contact with each other and generate internal stress to form metallic bonding. Otherwise, there may be a gap or a hole between the metals. However, the high temperature may cause a thermal damage and an early failure of temperature-sensitive components such as a memory. However, in a low temperature condition (for example, less than 200° C.), insufficient metal expansion causes a gap between the metals, and further causes a bonding defect. In addition, even if the metals protrude from a surface of a dielectric layer through process adjustment, due to a structural feature limitation, a surrounding dielectric layer strongly binds the metals, and compression of the metals in a longitudinal direction (a normal direction on a surface of a wafer) is limited. This causes a bonding gap or layering of the dielectric layer.

How to reduce a process temperature and avoid the bonding defect to implement hybrid bonding at a low temperature is a technical problem that urgently needs to be resolved currently.

SUMMARY

This application provides a hybrid bonding structure and a hybrid bonding method. A gap area is disposed between a metal and an insulation dielectric on a surface of a chip, and when a surface of the metal is higher than the insulation dielectric, the metal is longitudinally and transversely deformed in the disposed gap area, to avoid a bonding gap or layering of a dielectric layer, and implement hybrid bonding at a low temperature.

According to a first aspect, an embodiment of this application discloses a hybrid bonding structure. The hybrid bonding structure includes a first chip and a second chip. A surface of the first chip includes a first dielectric layer and a first metal layer, the first dielectric layer includes a first insulation dielectric, the first metal layer includes a first metal, and there is a first gap area between an edge of the first metal and the first insulation dielectric. A surface of the second chip includes a second dielectric layer and a second metal layer, the second dielectric layer includes a second insulation dielectric, and the second metal layer includes a second metal. Metallic bonding is formed after the first metal is in contact with the second metal, and the first metal is longitudinally and transversely deformed in the first gap area. Insulation dielectric bonding is formed after the first insulation dielectric is in contact with the second insulation dielectric.

In the hybrid bonding structure provided in the first aspect, a surface of the first metal is higher than a surface of the first insulation dielectric, and the first gap area is disposed between the first insulation dielectric and the first metal, so that after the first metal is in contact with the second metal to form the metallic bonding, the first metal may be longitudinally and transversely deformed in the first gap area. In other words, in a hybrid bonding process, the first metal may no longer be strongly bound by the first insulation dielectric, and can generate longitudinal collapse and transverse extension in the first gap area, to ensure that the first insulation dielectric can be in full contact with the second insulation dielectric to form insulation dielectric bonding, so that a process temperature can be reduced, a bonding defect can be avoided, and hybrid bonding of a metal and an insulation dielectric can be implemented at a low temperature.

In a possible implementation of the first aspect, a surface of the second metal is higher than a surface of the second insulation dielectric. When the surface of the first metal is higher than the surface of the first insulation dielectric and the surface of the second metal is higher than the surface of the second insulation dielectric, both the first metal and the second metal may be longitudinally and transversely deformed in the first gap area at the same time, to ensure that the first insulation dielectric is in full contact with the second insulation dielectric to form insulation dielectric bonding. This implements hybrid bonding of a metal and an insulation dielectric at a low temperature, avoids a bonding defect, and improves a yield rate of mass production.

In a possible implementation of the first aspect, there is a disc-shaped depression on the surface of the first metal and/or the surface of the second metal. The disc-shaped depression is caused by a chemical mechanical polishing (CMP) process. A larger surface of the first metal or a larger surface of the second metal indicates a larger depth of the disc-shaped depression.

In a possible implementation of the first aspect, a height difference between the surface of the first metal and the surface of the first insulation dielectric is greater than a sum of a depth of the disc-shaped depression on the surface of the first metal and a depth of the disc-shaped depression on the surface of second metal. This may ensure that the first metal can be in full contact with the second metal, and a gap or a hole between the first metal and the second metal may be avoided when metallic bonding is formed, to further improve the yield rate of mass production.

In a possible implementation of the first aspect, the height difference ensures that the metallic bonding is formed before the insulation dielectric bonding in a bonding process. Because the surface of the first metal is higher than the surface of the first insulation dielectric, and the height difference is greater than the sum of the depth of the disc-shaped depression on the surface of the first metal and the depth of the disc-shaped depression on the surface of second metal, it can be ensured that the first metal and the second metal are first in contact with each other and then form metallic bonding. This can avoid a case in which after insulation dielectrics are first in contact with each other to form insulation dielectric bonding, the first metal or the second metal needs to be expanded and contacted a high temperature to form metallic bonding. Therefore, a process temperature can be reduced, to implement hybrid bonding at a low temperature.

In a possible implementation of the first aspect, there is a second gap area between an edge of the second metal and the second insulation dielectric. There is the first gap area on the surface of the first chip, and there may be a second gap area on the surface of the second chip. The second gap area may be the same as or different from the first gap area. There is a gap area on the surface of the first chip and on the surface of the second chip, so that sufficient space can be ensured to accommodate longitudinal deformation and transverse deformation of the first metal, to further avoid a bonding defect.

In a possible implementation of the first aspect, a width range of the first gap area and/or the second gap area is between 10 nanometers and 1,000 nanometers. When the width of the first gap area or the second gap area is excessively narrow, deformation of the first metal may be limited, in other words, there is insufficient space to accommodate longitudinal deformation and transverse deformation of the first metal, and this causes a bonding defect. When the width of the first gap area or the second gap area is excessively wide, a waste of an area of an insulation dielectric bonding area on the surface of the first chip or the second chip is caused.

In a possible implementation of the first aspect, the first dielectric layer further includes a third insulation dielectric, and there is the first gap area between the edge of the first metal and the third insulation dielectric. When the first dielectric layer on the surface of the first chip includes a plurality of insulation dielectrics, the first gap area may penetrate one of the plurality of insulation dielectrics. For example, the first dielectric layer includes the first insulation dielectric and the third insulation dielectric, there is the first gap area between the third insulation dielectric and the first metal, and the first insulation dielectric is closely combined with the first metal. The first gap area may also penetrate at least two or all the insulation dielectrics. For example, the first dielectric layer includes the first insulation dielectric and the third insulation dielectric, there is the first gap area between the first insulation dielectric and the first metal, and there is also the first gap area between the third insulation dielectric and the first metal. In this way, a shape and a range of the first gap area can be flexibly changed, to better meet an actual requirement.

In a possible implementation of the first aspect, the first gap area is filled with an organic polymer. For example, the first gap area is filled with synthetic rubber, synthetic fiber, polyethylene, or polyvinyl chloride. Because the organic polymer has good retractility and ductility, binding of the organic polymer to the first metal is far less than binding of the first insulation dielectric to the first metal. Therefore, the first metal may be longitudinally and transversely deformed in the first gap area filled with the organic polymer, a bonding defect can be avoided, and a yield rate of mass production can be improved.

In a possible implementation of the first aspect, the first insulation dielectric or the second insulation dielectric is one of silicon oxide, silicon nitride, silicon oxynitride, silicon carbonitride, aluminum oxide, amorphous silicon, silicon carbide, or aluminum nitride, for example, the first insulation dielectric is silicon oxide, and the second insulation dielectric is silicon nitride. The first metal or the second metal is one of copper, gold, silver, aluminum, nickel, tungsten, titanium, tin, conductive graphene, or a carbon nanotube, for example, the first metal is copper, and the second metal is tin. The third insulation dielectric is one of silicon nitride, silicon carbonitride, aluminum oxide, amorphous silicon, silicon carbide, or aluminum nitride, for example, the third insulation dielectric is aluminum oxide.

In a possible implementation of the first aspect, the first insulation dielectric is the same as the second insulation dielectric, and the first metal is the same as the second metal. When the first insulation dielectric is the same as the second insulation dielectric, the first chip and the second chip may be better controlled in a hybrid bonding process to implement bonding between the first insulation dielectric and the second insulation dielectric, and a process is simple and is easy to implement. Likewise, when the first metal is the same as the second metal, it is easier to implement bonding between the first metal and the second metal.

In a possible implementation of the first aspect, a cross section of the first metal and/or the second metal is rectangular, square, regularly trapezoidal, inversely trapezoidal, conical, or T-shaped. For example, when the first metal is processed by using a dual damascene process, the cross section of the first metal is T-shaped.

According to a second aspect, an embodiment of this application discloses a hybrid bonding method. The method includes: providing a first chip, where a surface of the first chip includes a first dielectric layer and a first metal layer, the first dielectric layer includes a first insulation dielectric, the first metal layer includes a first metal, there is a first gap area between an edge of the first metal and the first insulation dielectric, and a surface of the first metal is higher than a surface of the first insulation dielectric; providing a second chip, where a surface of the second chip includes a second dielectric layer and a second metal layer, the second dielectric layer includes a second insulation dielectric, and the second metal layer includes a second metal; connecting the first metal with the second metal to form metallic bonding after the first metal is in contact with the second metal; and longitudinally and transversely deforming the first metal in the first gap area, to form insulation dielectric bonding after the first insulation dielectric is in contact with the second insulation dielectric.

The hybrid bonding method is used to form the hybrid bonding structure according to any one of the first aspect and the possible implementations of the first aspect. In the hybrid bonding method provided in the second aspect, after the first metal and the second metal are first in contact with each other and form metallic bonding, the first metal is longitudinally and transversely deformed in the first gap area under an applied external pressure, to ensure that the first insulation dielectric can be in full contact with the second insulation dielectric, to further form insulation dielectric bonding. Finally, hybrid bonding of the metals and the insulation dielectrics is formed. This can reduce a process temperature, avoid a bonding defect, and improve a yield rate of mass production.

According to a third aspect, an embodiment of this application provides a three-dimensional integrated circuit device. The three-dimensional integrated circuit device includes the hybrid bonding structure according to any one of the first aspect and the possible implementations of the first aspect.

DESCRIPTION OF EMBODIMENTS

Figure 1:
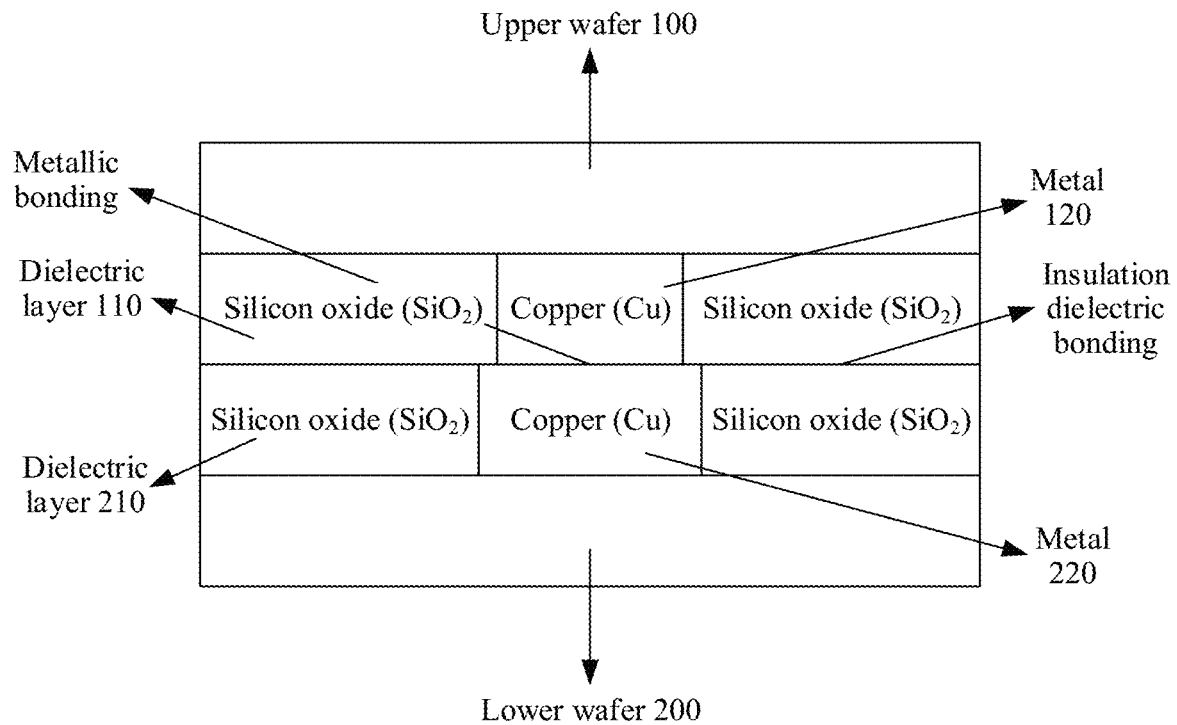
FIG. 1 is a schematic diagram of a cross section of a hybrid bonding structure according to an embodiment of this application.

For ease of understanding, some concepts and backgrounds are first briefly described.

A wafer refers to a silicon wafer used in manufacturing of a silicon semiconductor integrated circuit. The wafer has a circular shape, and therefore it is referred to as wafer. Various circuit component structures may be manufactured on the silicon wafer, to obtain an integrated circuit (IC) product having a specific electrical function.

A die is a small piece cut from a wafer, and is also referred to as a chip. Before a wafer is packaged, a chip on the wafer or a chip obtained by cutting the wafer is referred to as a bare chip.

There are an insulation dielectric and a metal on a surface of each of the wafer and the chip obtained by cutting the wafer. It should be noted that a hybrid bonding structure described in the embodiments of this application may be obtained by performing hybrid bonding on wafers, performing hybrid bonding on chips that are obtained by cutting a wafer, or performing hybrid bonding on a wafer and a chip. This is not limited in this application.

Wafer bonding is a technology in which wafers are bonded to form mechanical and electrical connections, and is used to manufacture a 3D structure, for example, a 3D IC, a micro-electro-mechanical system (MEMS), a complementary metal oxide semiconductor (CMOS) image sensor, and the like.

Hybrid bonding is a wafer bonding technology, and includes both metallic bonding (bonding between metals) and dielectric bonding (bonding between dielectric layer materials).

A three-dimensional stacking technology uses a micro-mechanical processing technology such as stacking technology or via interconnection to form three-dimensional integration, signal connection, wafer-level package, chip-level package, silicon cap package, and the like in Z-axis directions of chips or structures with different functions, to improve reliability. In a three-dimensional chip stacking technology, compared with a conventional two-dimensional chip in which all modules are placed at a planar layer, a three-dimensional chip allows multi-layer stacking, and a through-silicon via (TSV) is used to provide vertical communication between a plurality of dies. The three-dimensional chip is formed by vertically stacking a plurality of planar device layers, and interlayer interconnection is performed by using the through-silicon via, to shorten a length of an interconnection line, improve chip integration, reduce chip power consumption, obtain a smaller chip size is obtained, and better meet a bandwidth requirement.

A micro-bump bonding technology is a process used in early three-dimensional stacking, and is mainly applied to package-on-package stacking and low-intensity chip-on-chip stacking. In this technology, a signal and a power supply is transmitted in a vertical direction (namely, between a front surface and a rear surface of a chip) of a TSV, and the signal is transmitted to a next layer by means of bonding implemented by using a metal (for example, copper) micro bump, to implement three-dimensional interconnection between layers. In this technology, a filling material needs to be filled in a gap between the layers. If a micro-bump technology is used to implement three-dimensional stacking, the following problems may be caused:

(1) Because a heat conductivity of the filling material is far lower than a heat conductivity of silicon, transfer of heat inside a chip to the outside is limited, and this causes a severe heat dissipation problem.

(2) A pitch of a micro bump is usually greater than 30 microns, and after density is increased, problems such as bridging and poor soldering easily occur, and a high-density three-dimensional interconnection requirement cannot be met.

To resolve the problems caused by micro-bump bonding, a dielectric wafer bonding technology is used.

The dielectric wafer bonding technology enables a wafer to form a covalent bond by using a high temperature between dielectric layers (generally silicon oxide SiO2) for bonding, and after bonding, a through-silicon via is made for interconnection with a metal, to indirectly implement signal transmission between layers, and avoid use of high thermal resistance (namely, a filling material). Eight-layer dynamic random access memory (DRAM) stacking implemented by using wafer bonding can reduce thermal resistance by 50% compared with micro-bump bonding. Although the dielectric wafer bonding technology resolves a heat dissipation problem and a high-density three-dimensional interconnection problem that are caused by micro-bump bonding, the dielectric wafer bonding technology may bring the following new problems:

Because the through-silicon via is made after dielectric layer bonding to implement three-dimensional interconnection, flexibility and an application scope of the technology are limited. For example, generally, to improve density of the through-silicon via, a TSV-middle process is usually used (to be specific, a TSV is made after a front-end of the line (FEOL) device layer is manufactured and before a back-end of the line (BEOL) wiring layer is completed), instead of a TSV-last (TSV-last) process (to be specific, a TSV is made after the BEOL wiring layer is completed). However, it is difficult to make a through-silicon via with a small size, high density, and a high depth ratio after bonding.

To resolve a defect of dielectric wafer bonding, a hybrid bonding technology is used.

Figure 2:
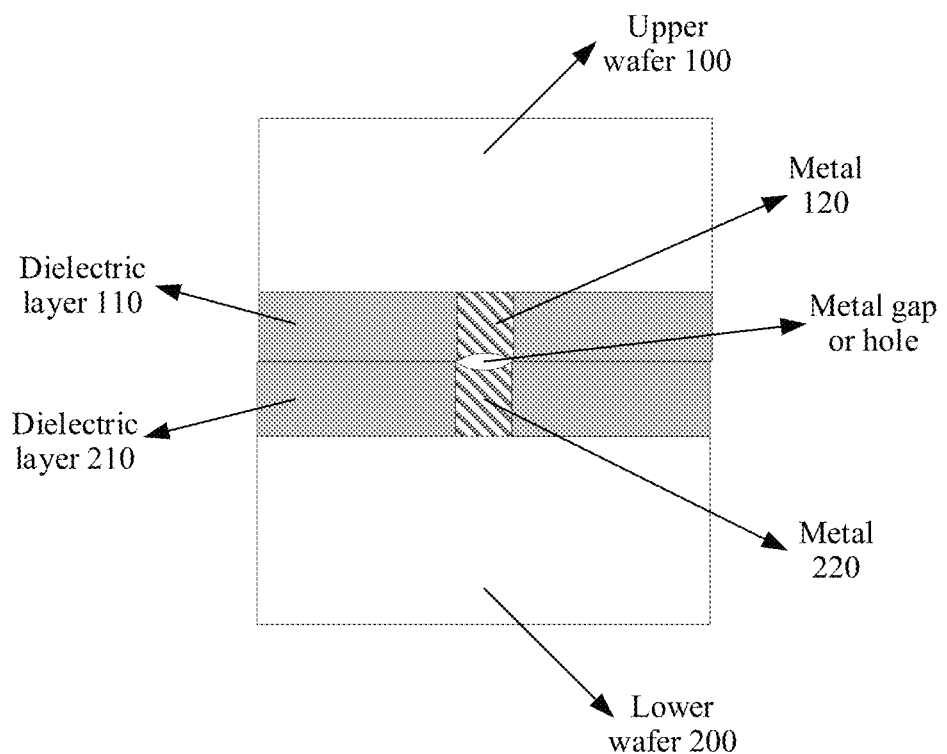
FIG. 2 is a schematic diagram of a structure of a metallic bonding defect according to an embodiment of this application.

According to the hybrid bonding technology, a metallic bonding structure is directly formed on a wafer surface, and three-dimensional stacking of low thermal resistance, high density, and high performance is implemented through simultaneous bonding between metals and between dielectrics. As shown in FIG. 1, there are a dielectric layer 110 (for example, $SiO_2$) and a metal 120 (for example, copper (Cu)) on a surface of an upper wafer 100, and there are a dielectric layer 210 (for example, $SiO_2$) and a metal 220 (for example, copper (Cu)) on a surface of a lower wafer 200. The dielectric layer 110 on the surface of the upper wafer 100 is in contact with the dielectric layer 210 on the surface of the lower wafer 200 to form dielectric bonding, and the metal 120 on the surface of the upper wafer 100 is in contact with the metal 220 on the surface of the lower wafer 200 to form metallic bonding. Compared with the dielectric wafer bonding technology, the hybrid bonding technology further improves a heat dissipation capability, is further compatible with a plurality of TSV processes (including a TSV-first process, the TSV-middle process, the TSV-last process, and the like), and when there are a large quantity of integrated layers, may effectively reduce TSV manufacturing costs. Although the hybrid bonding technology resolves the problem that the dielectric wafer bonding technology is not flexible enough and has a limited application scope, due to a structural feature limitation, the metals are allowed to expand or be compressed only in a longitudinal direction (a normal direction of the wafer surface). This also brings the following new problems:

Because a wafer surface polishing process causes depressions on surfaces of the metals, dielectric layers are first in contact with each other (in this case, the metals are not in contact due to the depressions) to form dielectric bonding, and then heating and annealing are performed to make the metals expand to contact with each other and produce internal stress to form metallic bonding. A sufficiently high temperature (for example, 300° C. to 400° C.) is required to ensure sufficient expansion and internal stress of the metals. Otherwise, a gap or a hole may be caused between the metals. However, a high temperature may cause a thermal damage and an early failure of a temperature-sensitive component such as a memory. In addition, in a low temperature condition, a gap between the metals that is caused by insufficient expansion of the metals causes a bonding defect. As shown in FIG. 2, there is a gap between the metal 120 on the surface of the upper wafer 100 and the metal 220 on the surface of the lower wafer 200 due to insufficient expansion, and this causes a bonding defect.

To resolve the foregoing problems, this application provides a hybrid bonding structure and a hybrid bonding method, to reduce a process temperature, avoid a bonding defect, and implement hybrid bonding at a low temperature.

The following clearly describes the technical solutions in the embodiments of this application with reference to the accompanying drawings in the embodiments of this application.

It should be noted that, in the embodiments of this application, a hybrid bonding structure and a hybrid bonding method are described by using an example in which hybrid bonding is performed between chips. However, it should be understood that, the hybrid bonding structure provided in this application may alternatively be obtained by performing hybrid bonding between a wafer and a chip or between wafers.

A chip in the embodiments of this application may be a chip such as a memory, an MEMS, a microwave radio frequency chip, or an application-specific integrated circuit (ASIC). It should be understood that the chip listed herein is merely an example for description. This is not limited in this application.

Figure 3:
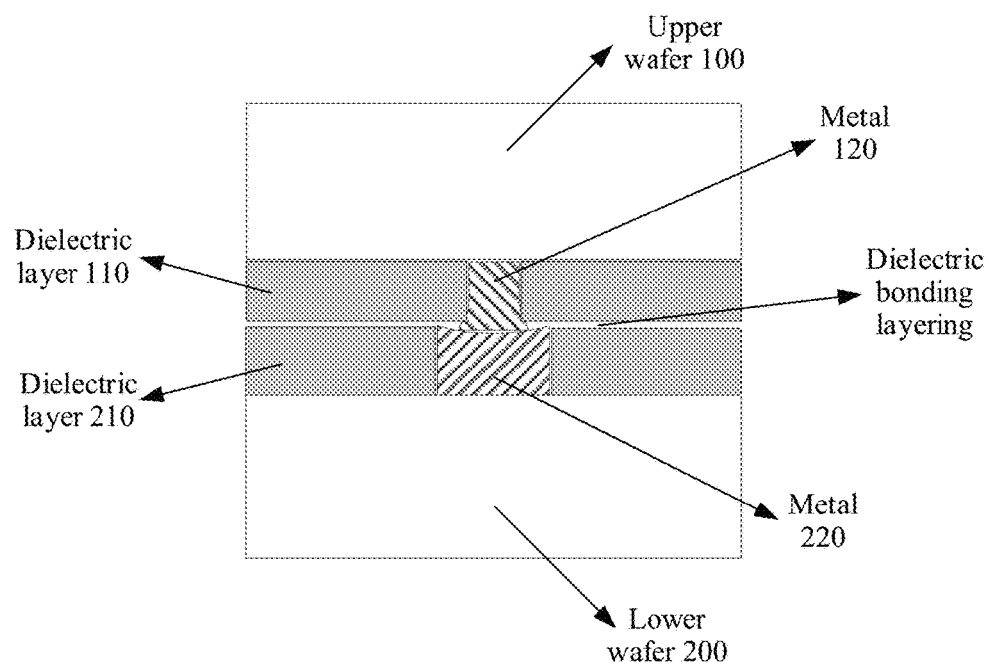
FIG. 3 is a schematic diagram of a structure of a dielectric bonding defect according to an embodiment of this application.

Generally, a metal and a dielectric layer on a surface of a wafer or a chip are closely combined, and the dielectric layer strongly binds the metal. As a result, when hybrid bonding is performed on two wafers or chips, compression of metals is limited in a longitudinal direction, and this causes a bonding gap or layering of dielectric layers (in other words, the dielectric layers are not in full contact or cannot be in contact with each other). As shown in FIG. 3, because compression of the metal 120 is limited in a longitudinal direction, there is a gap or layering between the dielectric layer 110 on the surface of the upper wafer 100 and the dielectric layer 210 on the surface of the lower wafer 200, and this causes a dielectric bonding defect. Therefore, this application provides a first chip 10 and a second chip 20 described in the following embodiments, to implement hybrid bonding of a metal and an insulation dielectric in a non-high temperature environment.

Embodiment 1

Figure 4A:
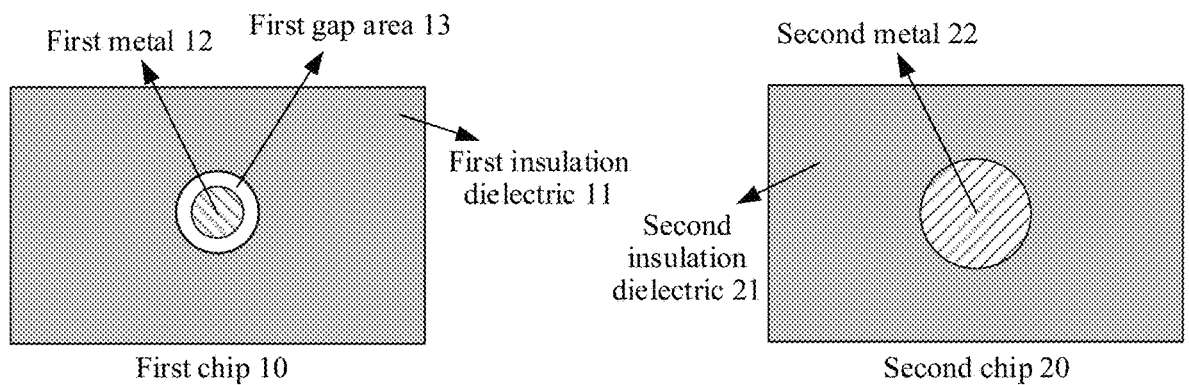
FIG. 4A is a schematic top view of a to-be-bonded structure according to an embodiment of this application.
Figure 4B:
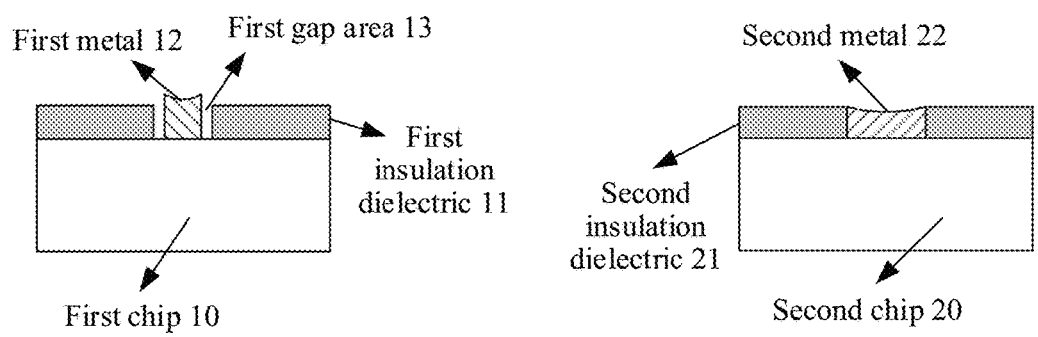
FIG. 4B is a schematic diagram of a cross section of a to-be-bonded structure according to an embodiment of this application.

Refer to FIG. 4A. FIG. 4A is a schematic top view of a to-be-bonded structure according to an embodiment of this application. As shown in FIG. 4A, the to-be-bonded structure includes the first chip 10 and the second chip 20. There are a first insulation dielectric 11 and a first metal 12 on a surface of the first chip 10, and there is a first gap area 13 between the first insulation dielectric 11 and the first metal 12. There are a second insulation dielectric 21 and a second metal 22 on a surface of the second chip 20, and the second insulation dielectric 21 is closely combined with the second metal 22. Refer to FIG. 4B. FIG. 4B is a schematic diagram of a cross section of the to-be-bonded structure. As shown in FIG. 4B, one end of the first metal 12 is coupled to an internal circuit of the first chip 10, and the other end of the first metal 12 is configured to be in contact with the second metal 22 to perform metallic bonding. The first metal 12 penetrates the first insulation dielectric 11, and a surface of the first metal 12 is higher than a surface of the first insulation dielectric 11. There is the first gap area 13 between the first insulation dielectric 11 and the first metal 12, and the first gap area 13 completely isolates the first insulation dielectric 11 from the first metal 12. One end of the second metal 22 is coupled to an internal circuit of the second chip 20, the other end of the second metal 22 is configured to be in contact with the first metal 12 to perform metallic bonding. The second metal 22 penetrates the second insulation dielectric 21, and a surface of the second metal 22 is not higher than a surface of the second insulation dielectric 21.

It should be noted that, through process adjustment, a metal on a surface of a wafer or a chip may protrude from a surface of a dielectric layer. For example, in FIG. 4B, the surface of the first metal 12 is higher than the surface of the first insulation dielectric 11, so that the metals can be in contact with each other earlier than the dielectric layers to form metallic bonding.

Figure 5:
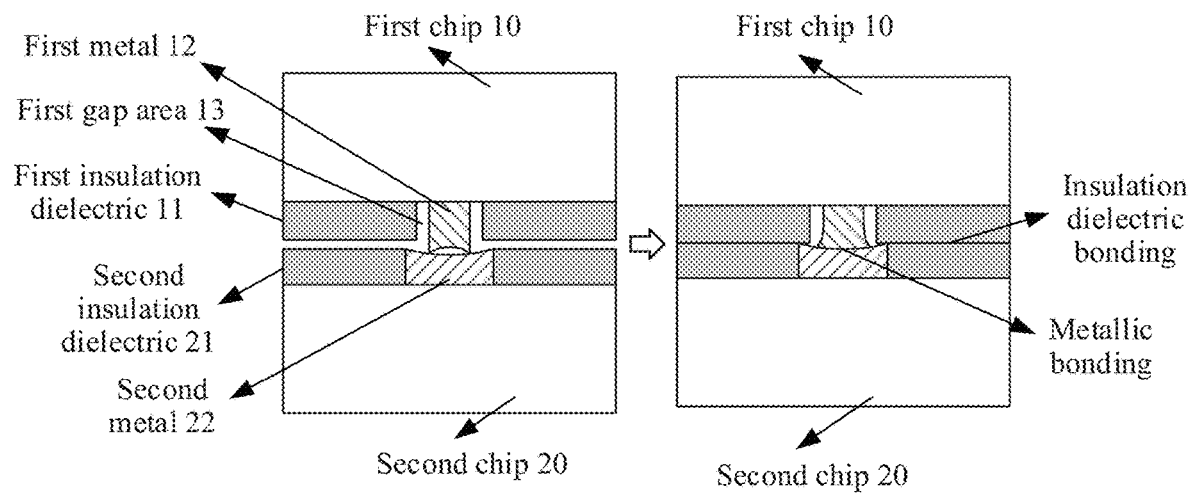
FIG. 5 is a schematic diagram of a cross section of another hybrid bonding structure according to an embodiment of this application.

Refer to FIG. 5. FIG. 5 is a schematic diagram of a cross section of another hybrid bonding structure according to this application. As shown in FIG. 5, the first chip 10 in an upper part and a second chip 20 in a lower part are connected. Because the surface of the first metal 12 is higher than the surface of the first insulation dielectric 11, the first metal 12 and the second metal 22 are first in contact with each other. In this case, the first insulation dielectric 11 and the second insulation dielectric 21 are not in contact with each other. In a low-temperature (for example, not higher than 200° C.) environment, after the first metal 12 is in contact with the second metal 22 to form metallic bonding, the first metal 12 is longitudinally and transversely deformed (specifically, longitudinal collapse and transverse extension) in the first gap area 13 under an appropriate external pressure (the pressure is evenly applied by bonding tables to entire surfaces of the first chip 10 and the second chip 20) provided by the bonding tables (the first chip 10 and the second chip 20 are separately disposed on two parallel opposite bonding tables in a vertical direction), until the first insulation dielectric 11 is in full contact with the second insulation dielectric 21 and insulation dielectric bonding is formed. Finally, the first metal 12 of the first chip 10 and the second metal 22 of the second chip 20 form metallic bonding, and the first insulation dielectric 11 of the first chip 10 and the second insulation dielectric 21 of the second chip 20 form insulation dielectric bonding, to form the hybrid bonding structure shown in FIG. 5. It should be understood that one end and the other end of the first metal 12 are two opposite ends of the first metal 12, and one end and the other end of the second metal 22 are two opposite ends of the second metal 22.

It should be understood that the longitudinal deformation and the transverse deformation of the first metal 12 in the first gap area 13 may be elastic deformation or plastic deformation. This is not limited in this application.

It can be learned that in the hybrid bonding structure, the surface of the first metal 12 is higher than the surface of the first insulation dielectric 11, to ensure that the first metal 12 and the second metal 22 are first in contact with each other and form metallic bonding in a bonding process. In the first gap area 13, the first metal 12 is longitudinally and transversely deformed, to ensure that the first insulation dielectric 11 and the second insulation dielectric 21 can be in full contact with each other and form insulation dielectric bonding after the first metal 12 is longitudinally and transversely deformed. This avoids a dielectric bonding defect (namely, a dielectric bonding gap or layering), and improves a yield rate of mass production and long-term reliability of components.

Optionally, the first chip 10 may include a through-silicon via, a through-molding via, a through-insulation dielectric via, or a through-glass via. Alternatively, the second chip 20 includes a through-silicon via, a through-molding via, a through-insulation dielectric via, or a through-glass via. Alternatively, the first chip 10 and the second chip 20 each include a through-silicon via, a through-molding via, a through-insulation dielectric via, or a through-glass via.

Optionally, there is a disc-shaped depression on the surface of the first metal 12, the disc-shaped depression is caused by a chemical mechanical polishing (CMP) process, and a depth of the disc-shaped depression is less than 50 nanometers. Alternatively, there is the disc-shaped depression on the surface of the second metal 22, or there is the disc-shaped depression on the surface of each of the first metal 12 and the second metal 22.

Optionally, a thickness of the first metal 12, namely, a distance between a highest region (a non-disc-shaped depression region) on the surface of the first metal 12 and the bottom of the first metal 12, is between 100 nanometers and 10,000 nanometers. A thickness of the second metal 22, namely, a distance between a highest region on the surface of the second metal 22 and the bottom of the second metal 22, is between 100 nanometers and 10,000 nanometers. A height difference between the surface of the first metal 12 and the surface of the first insulation dielectric 11 is greater than a sum of a depth of the disc-shaped depression on the surface of the first metal 12 and a depth of the disc-shaped depression on the surface of the second metal 22. For example, if the depth of the disc-shaped depression on the surface of the first metal 12 is between 10 nanometers and 20 nanometers, and the depth of the disc-shaped depression on the surface of the second metal 22 is between 10 nanometers and 30 nanometers, the height difference between the surface of the first metal 12 and the surface of the first insulation dielectric 11 may be between 30 nanometers and 60 nanometers.

Optionally, the first gap area 13 may be formed by performing dry etching on the first insulation dielectric 11 or the first metal 12, or by performing wet etching on the first insulation dielectric 11 or the first metal 12. This is not limited in this application.

Optionally, a width range of the first gap area 13 is between 10 nanometers and 1,000 nanometers. It should be understood that an excessively narrow width of the first gap area 13 may limit transverse deformation of the first metal 12, and this causes a bonding defect when the first insulation dielectric 11 and the second insulation dielectric 21 are bonded. An excessively wide width of the first gap area 13 causes a waste of an area of an insulation dielectric bonding area on the surface of the first chip 10.

Optionally, a cross section of the first metal 12 and/or the second metal 22 may be rectangular, square, regularly trapezoidal, inversely trapezoidal, conical, or T-shaped. When the first metal 12 or the second metal 22 is a cylinder, the cross section of the first metal 12 or the second metal 22 is rectangular. When the first metal 12 or the second metal 22 is a circular truncated cone, the cross section of the first metal 12 or the second metal 22 is trapezoidal. Particularly, when the first metal 12 or the second metal 22 is processed by using a dual damascene process, the cross section of the first metal 12 or the second metal 22 is T-shaped. A processing technology of the first metal 12 or the second metal 22 and the shape of the cross section are not limited in this application.

For example, in FIG. 4A and FIG. 4B, the first metal 12 and the second metal 22 are cylinders. Therefore, top views of the first metal 12 and the second metal 22 are circular, and the cross sections of the first metal 12 and the second metal 22 are rectangular. A diameter of the first metal 12 may be between 100 nanometers and 10,000 nanometers, and a diameter of the second metal 22 may also be between 100 nanometers and 10,000 nanometers. Certainly, the diameter of the first metal 12 may be less than the diameter of the second metal 22.

Optionally, the first insulation dielectric 11 may be one of silicon oxide, silicon nitride, silicon oxynitride, silicon carbonitride, aluminum oxide, amorphous silicon, silicon carbide, aluminum nitride, or the like. The second insulation dielectric 21 may be one of silicon oxide, silicon nitride, silicon oxynitride, silicon carbonitride, aluminum oxide, amorphous silicon, silicon carbide, aluminum nitride, or the like. The first metal 12 may be one of or an alloy formed by more of copper, gold, silver, aluminum, nickel, tungsten, titanium, tin, conductive graphene, or a carbon nanotube. The second metal may be one of or an alloy formed by more of copper, gold, silver, aluminum, nickel, tungsten, titanium, tin, conductive graphene, or a carbon nanotube.

Optionally, the first insulation dielectric 11 is the same as the second insulation dielectric 21, and the first metal 21 is the same as the second metal 22. It may be understood that when the first insulation dielectric 11 is the same as the second insulation dielectric 21, bonding between the insulation dielectrics can be better implemented, and a process is relatively simple and is easy to implement. Likewise, when the first metal 12 is the same as the second metal 22, bonding between the metals can be better implemented, and a process is relatively simple and is easy to implement.

Embodiment 2

This embodiment and the embodiment 1 are based on a same inventive concept. A difference lies in that, in the embodiment 1, the first gap area 13 completely penetrates the first insulation dielectric 11, but in this embodiment, the first gap area 13 does not completely penetrate the first insulation dielectric, in other words, the first insulation dielectric 11 is not completely isolated from the first metal 12.

Figure 6:
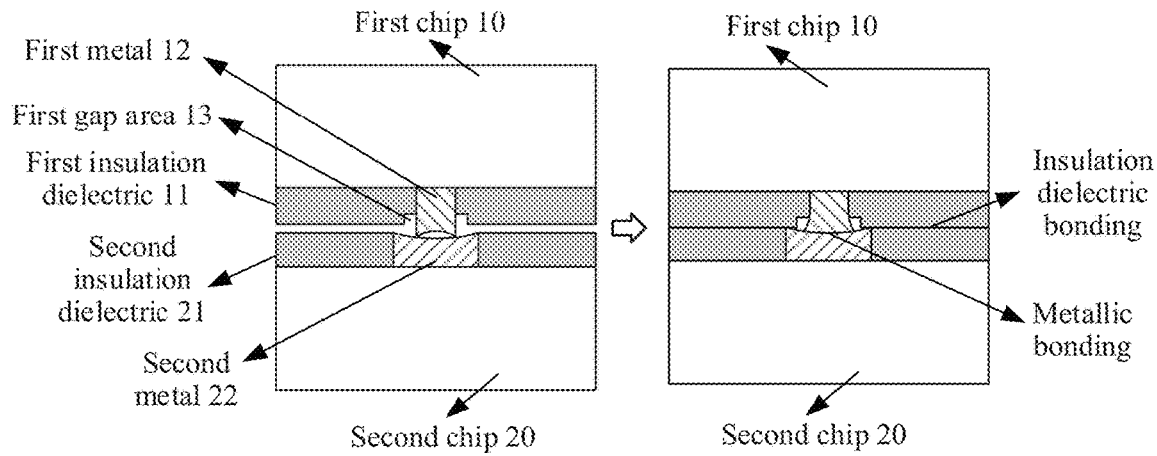
FIG. 6 is a schematic diagram of a cross section of still another hybrid bonding structure according to an embodiment of this application.

Refer to FIG. 6. FIG. 6 is a schematic diagram of a cross section of still another hybrid bonding structure according to this application. As shown in FIG. 6, a first chip 10 in an upper part and a second chip 20 in a lower part are connected. There are a first insulation dielectric 11 and a first metal 12 on a surface of the first chip 10. A surface of the first metal 12 is higher than a surface of the first insulation dielectric 11. There is a first gap area 13 between the first insulation dielectric 11 and the first metal 12. The first gap area 13 does not completely penetrate the first insulation dielectric 11, some parts between the first insulation dielectric 11 and the first metal 12 are isolated by the first gap area 13, and some other parts are closely combined. There are a second insulation dielectric 21 and a second metal 22 on a surface of the second chip 20. A surface of the second metal 22 is not higher than a surface of the second insulation dielectric 21. The second insulation dielectric 21 is closely combined with the second metal 22. The first metal 12 and the second metal 22 are first in contact with each other to form metallic bonding. The first metal 12 is longitudinally and transversely deformed in the first gap area 13 under an appropriate external pressure provided by bonding tables, until the first insulation dielectric 11 and the second insulation dielectric 21 are in full contact with each other and form insulation dielectric bonding. Finally, a hybrid bonding structure of the metals and the insulation dielectrics is formed.

It should be understood that, except that the first gap areas 13 are different, the other features in the embodiment 2 may be completely the same as those in the embodiment 1, for example, a material of the first insulation dielectric 11 or the second insulation dielectric 21, a material of the first metal 12 or the second metal 22, and shapes of cross sections. Refer to related descriptions in the embodiment 1. For brevity, details are not described herein again.

Embodiment 3

This embodiment is based on a same inventive concept as the embodiment 1 and the embodiment 2. A difference lies in that, in the embodiment 1 and the embodiment 2, the surface of the first metal 12 is higher than the surface of the first insulation dielectric 11, and the surface of the second metal 22 is not higher than the surface of the second insulation dielectric 21, but in this embodiment, the surface of the first metal 12 is not higher than the surface of the first insulation dielectric 11, and the surface of the second metal 22 is higher than the surface of the second insulation dielectric 21.

Figure 7:
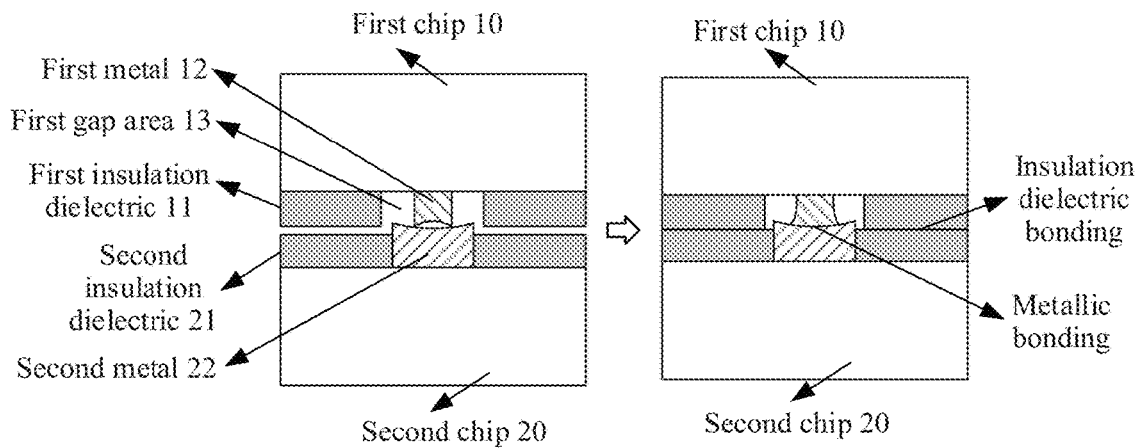
FIG. 7 is a schematic diagram of a cross section of still another hybrid bonding structure according to an embodiment of this application.

Refer to FIG. 7. FIG. 7 is a schematic diagram of a cross section of still another hybrid bonding structure according to this application. As shown in FIG. 7, a first chip 10 in an upper part and a second chip 20 in a lower part are connected. There are a first insulation dielectric 11 and a first metal 12 on a surface of the first chip 10. A surface of the first metal 12 is not higher than a surface of the first insulation dielectric 11. There is a first gap area 13 between the first insulation dielectric 11 and the first metal 12. The first gap area 13 completely penetrates the first insulation dielectric 11, in other words, the first gap area 13 completely isolates the first insulation dielectric 11 from the first metal 12. There is a second insulation dielectric 20 and a second metal 22 on a surface of the second chip 20. A surface of the second metal 22 is higher than a surface of the second insulation dielectric 21. The second insulation dielectric 21 is closely combined with the second metal 22. The second metal 22 and the first metal 12 are first in contact with each other to form metallic bonding. The second metal 22 is longitudinally and transversely deformed in the first gap area 13 under an appropriate external pressure provided by bonding tables, until the first insulation dielectric 11 and the second insulation dielectric 21 are in full contact with each other and form insulation dielectric bonding. Finally, a hybrid bonding structure of the metals and the insulation dielectrics is formed.

Optionally, there is a disc-shaped depression on the surface of the first metal 12, the disc-shaped depression is caused by a CMP process, and a depth of the disc-shaped depression is less than 50 nanometers. Alternatively, there is the disc-shaped depression on the surface of the second metal 22, or there is the disc-shaped depression on the surface of each of the first metal 12 and the second metal 22.

Optionally, a height difference between the surface of the second metal 22 and the surface of the second insulation dielectric 21 is greater than a sum of a depth of the disc-shaped depression on the surface of the first metal 12 and a depth of the disc-shaped depression on the surface of the second metal 22.

It should be understood that, except that the surface of the first metal 12 is not higher than the surface of the first insulation dielectric 11, and the surface of the second metal 22 is higher than the surface of the second insulation dielectric 21, the other features in the embodiment 3 may be completely the same as those of the embodiment 1 and the embodiment 2. Refer to related descriptions in the embodiment 1 and the embodiment 2. For brevity, details are not described herein again.

Embodiment 4

This embodiment is based on a same inventive concept as the embodiment 1 to the embodiment 3. A difference lies in that, in the embodiment 1 and the embodiment 2, the surface of the first metal 12 is higher than the surface of the first insulation dielectric 11, and the surface of the second metal 22 is not higher than the surface of the second insulation dielectric 21, but in this embodiment, the surface of the first metal 12 is higher than the surface of the first insulation dielectric 11, and the surface of the second metal 22 is higher than the surface of the second insulation dielectric 21.

Figure 8:
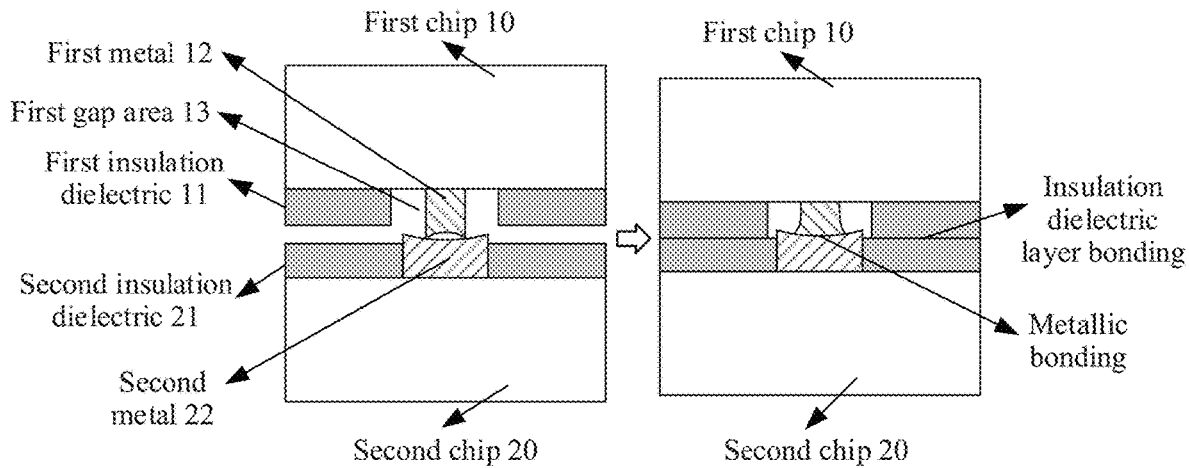
FIG. 8 is a schematic diagram of a cross section of still another hybrid bonding structure according to an embodiment of this application.

Refer to FIG. 8. FIG. 8 is a schematic diagram of a cross section of still another hybrid bonding structure according to this application. As shown in FIG. 8, a first chip 10 in an upper part and a second chip 20 in a lower part are connected. There are a first insulation dielectric 11 and a first metal 12 on a surface of the first chip 10. A surface of the first metal 12 is higher than a surface of the first insulation dielectric 11. There is a first gap area 13 between the first insulation dielectric 11 and the first metal 12. The first gap area 13 completely penetrates the first insulation dielectric 11, in other words, the first gap area 13 completely isolates the first insulation dielectric 11 from the first metal 12. There is a second insulation dielectric 20 and a second metal 22 on a surface of the second chip 20. A surface of the second metal 22 is higher than a surface of the second insulation dielectric 21. The second insulation dielectric 21 is closely combined with the second metal 22. The first metal 12 and the second metal 22 are first in contact with each other to form metallic bonding. The first metal 12 and the second metal 22 are longitudinally and transversely deformed in the first gap area 13 under an appropriate external pressure provided by bonding tables, until the first insulation dielectric 11 and the second insulation dielectric 21 are in full contact with each other and form insulation dielectric bonding. Finally, a hybrid bonding structure of the metals and the insulation dielectrics is formed.

It should be understood that, in this embodiment, the surface of the first metal 12 and the surface of the second metal 22 are respectively higher than the surface of the first insulation dielectric 11 and the surface of the second insulation dielectric 21, which may be understood as a combination of the embodiment 1 and the embodiment 3. Except for the distinguishing feature, the other features may be completely the same as those in the embodiment 1 and the embodiment 3. Refer to related descriptions in the embodiment 1 and the embodiment 3. For brevity, details are not described herein again.

Embodiment 5

This embodiment is based on a same inventive concept as all the foregoing embodiments. A difference lies in that, in the embodiment 2, the cross section of the first metal 12 is rectangular, but in this embodiment, because the first metal 12 is obtained by processing by using a dual damascene process, the cross section of the first metal 12 is T-shaped.

Figure 9:
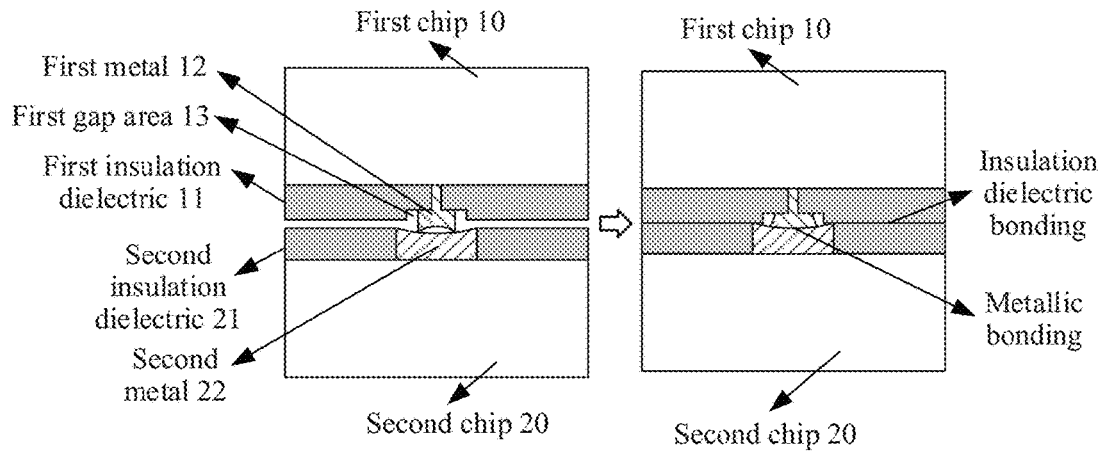
FIG. 9 is a schematic diagram of a cross section of still another hybrid bonding structure according to an embodiment of this application.

Refer to FIG. 9. FIG. 9 is a schematic diagram of a cross section of still another hybrid bonding structure according to this application. As shown in FIG. 9, a first chip 10 in an upper part and a second chip 20 in a lower part are connected. There are a first insulation dielectric 11 and a first metal 12 on a surface of the first chip 10. The first metal 12 is T-shaped. A surface of the first metal 12 is higher than a surface of the first insulation dielectric 11. There is a first gap area 13 between the first insulation dielectric 11 and the first metal 12. The first gap area 13 does not completely penetrate the first insulation dielectric 11, some parts between the first insulation dielectric 11 and the first metal 12 are isolated by the first gap area 13, and some other parts are closely combined. There are a second insulation dielectric 21 and a second metal 22 on a surface of the second chip 20. A surface of the second metal 22 is not higher than a surface of the second insulation dielectric 21. The second insulation dielectric 21 is closely combined with the second metal 22. The first metal 12 and the second metal 22 are first in contact with each other to form metallic bonding. The first metal 12 is longitudinally and transversely deformed in the first gap area 13 under an appropriate external pressure provided by bonding tables, until the first insulation dielectric 11 and the second insulation dielectric 21 are in full contact with each other and form insulation dielectric bonding. Finally, a hybrid bonding structure of the metals and the insulation dielectrics is formed.

It should be understood that, compared with the embodiment 1, in this embodiment, the first metal 11 has a different shape and a range and a size of the first gap area 13 are different. Compared with the embodiment 2, in this embodiment, only the first metal 11 has a different shape, and the other features may be completely the same. Refer to related descriptions in the embodiment 1 and the embodiment 2. For brevity, details are not described herein again.

Embodiment 6

This embodiment is based on a same inventive concept as all the foregoing embodiments. A difference lies in that, in the embodiment 1, the first gap area 13 is not filled with any substance, but in this embodiment, the first gap area 13 is filled with an organic polymer.

Figure 10:
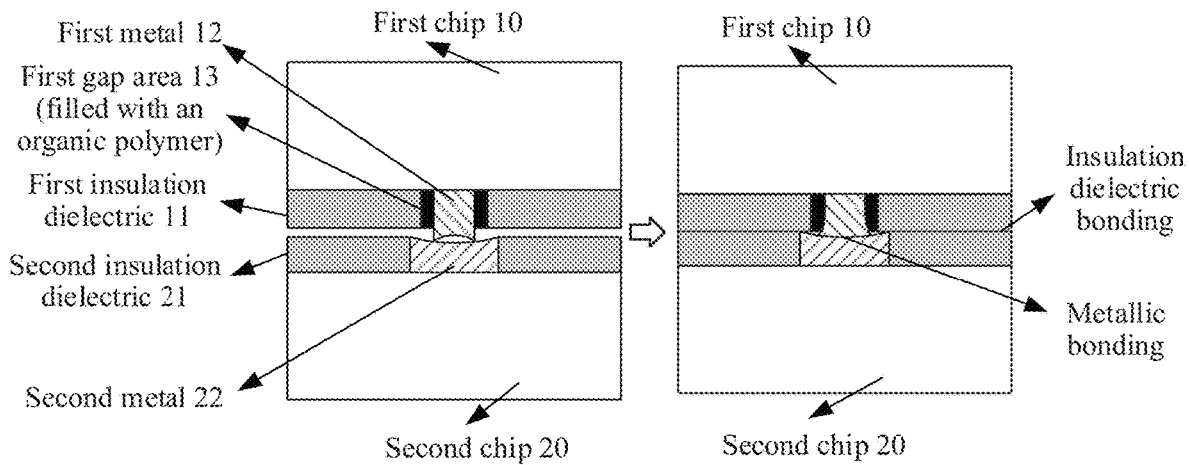
FIG. 10 is a schematic diagram of a cross section of still another hybrid bonding structure according to an embodiment of this application.

Refer to FIG. 10. FIG. 10 is a schematic diagram of a cross section of still another hybrid bonding structure according to this application. As shown in FIG. 10, a first chip 10 in an upper part and a second chip 20 in a lower part are connected. There are a first insulation dielectric 11 and a first metal 12 on a surface of the first chip 10. A surface of the first metal 12 is higher than a surface of the first insulation dielectric 11. There is a first gap area 13 between the first insulation dielectric 11 and the first metal 12. The first gap area 13 completely penetrates the first insulation dielectric 11, to completely isolate the first insulation dielectric 11 from the first metal 12, and the first gap area 13 is filled with an organic polymer. There are a second insulation dielectric 21 and a second metal 22 on a surface of the second chip 20. A surface of the second metal 22 is not higher than a surface of the second insulation dielectric 21. The second insulation dielectric 21 is closely combined with the second metal 22. The first metal 12 and the second metal 22 are first in contact with each other to form metallic bonding. Under an appropriate external pressure provided by bonding tables, the first metal 12 is longitudinally and transversely deformed in the first gap area 13 that is filled with an organic polymer, until the first insulation dielectric 11 and the second insulation dielectric 21 are in full contact with each other and form insulation dielectric bonding. Finally, a hybrid bonding structure of the metals and the insulation dielectrics is formed.

Optionally, the organic polymer may be a macromolecular polymer, for example, synthetic rubber, synthetic fiber, polyethylene, or polyvinyl chloride.

It should be understood that although the first gap area 13 is filled with an organic polymer, because the organic polymer has good retractility and ductility, binding of the organic polymer to the first metal 12 is far less than binding of the first insulation dielectric 11 to the first metal 12. Therefore, the first metal 12 may transversely extend in the first gap area that is filled with an organic polymer, to ensure that the first insulation dielectric 11 and the second insulation dielectric 21 can be in full contact with each other and form insulation dielectric bonding.

It should be further understood that, except that the first gap area 13 is filled with an organic polymer, the other features in this embodiment may be completely the same as those in the embodiment 1. Refer to related descriptions in the embodiment 1. For brevity, details are not described herein again.

Embodiment 7

This embodiment is based on a same inventive concept as all the foregoing embodiments. A difference lies in that, in the embodiment 1, the second insulation dielectric 21 is closely combined with the second metal 22, but in this embodiment, there is a second gap area 23 between the second insulation dielectric 21 and the second metal 22.

Figure 11:
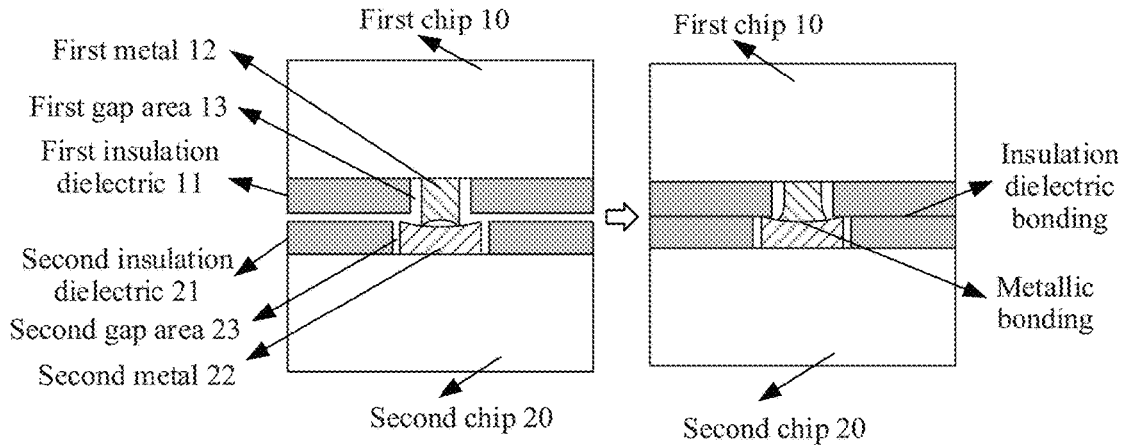
FIG. 11 is a schematic diagram of a cross section of still another hybrid bonding structure according to an embodiment of this application.

Refer to FIG. 11. FIG. 11 is a schematic diagram of a cross section of still another hybrid bonding structure according to this application. As shown in FIG. 11, a first chip 10 in an upper part and a second chip 20 in a lower part are connected. There are a first insulation dielectric 11 and a first metal 12 on a surface of the first chip 10. A surface of the first metal 12 is higher than a surface of the first insulation dielectric 11. There is a first gap area 13 between the first insulation dielectric 11 and the first metal 12. The first gap area 13 completely penetrates the first insulation dielectric 11, to completely isolate the first insulation dielectric 11 from the first metal 12. There are a second insulation dielectric 21 and a first metal 22 on a surface of the second chip 20. A surface of the second metal 22 is not higher than a surface of the second insulation dielectric 21. There is the second gap area 23 between the second insulation dielectric 21 and the second metal 22. The second gap area 23 completely penetrates the second insulation dielectric 21, to completely isolate the second insulation dielectric 21 from the second metal 22. The first metal 12 and the second metal 22 are first in contact with each other to form metallic bonding. The first metal 12 and/or the second metal 22 are/is longitudinally and transversely deformed in the first gap area 13/and or the second gap area 23 under an appropriate external pressure provided by bonding tables, until the first insulation dielectric 11 and the second insulation dielectric 21 are in full contact with each other and form insulation dielectric bonding. Finally, a hybrid bonding structure of the metals and the insulation dielectrics is formed.

Optionally, a width range of the second gap area 23 is between 10 nanometers and 1,000 nanometers.

Optionally, the first gap area 13 is filled with an organic polymer, or the second gap area 23 is filled with an organic polymer, or both the first gap area 13 and the second gap area 23 are filled with an organic polymer.

Optionally, a cross section of the first metal 12 and/or the second metal 22 may be rectangular, square, regularly trapezoidal, inversely trapezoidal, conical, or T-shaped.

It should be understood that, compared with the embodiment 1, in this embodiment, except that there is the second gap area 23 between the second insulation dielectric 21 and the second metal 22, the other features may be completely the same. Refer to related descriptions in the embodiment 1. For brevity, details are not described herein again.

Embodiment 8

This embodiment is based on a same inventive concept as all the foregoing embodiments. A difference lies in that, in the embodiment 1, the surface of the first chip 10 includes only a single-layer insulation dielectric (for example, the first insulation dielectric 11), and the surface of the second chip 20 includes only a single-layer insulation dielectric (for example, the second insulation dielectric 21), but in this embodiment, there are a plurality of layers of insulation dielectrics (for example, the first insulation dielectric 11 and a third insulation dielectric 14) on the surface of the first chip 10, and there are a plurality of layers of insulation dielectrics (for example, the second insulation dielectric 21 and a fourth insulation dielectric 24) on the surface of the second chip 20. In addition, there is also a first gap area 13 between the third insulation dielectric 14 and the first metal 12, and the first gap area 13 penetrates both the first insulation dielectric 11 and the third insulation dielectric 14.

Figure 12:
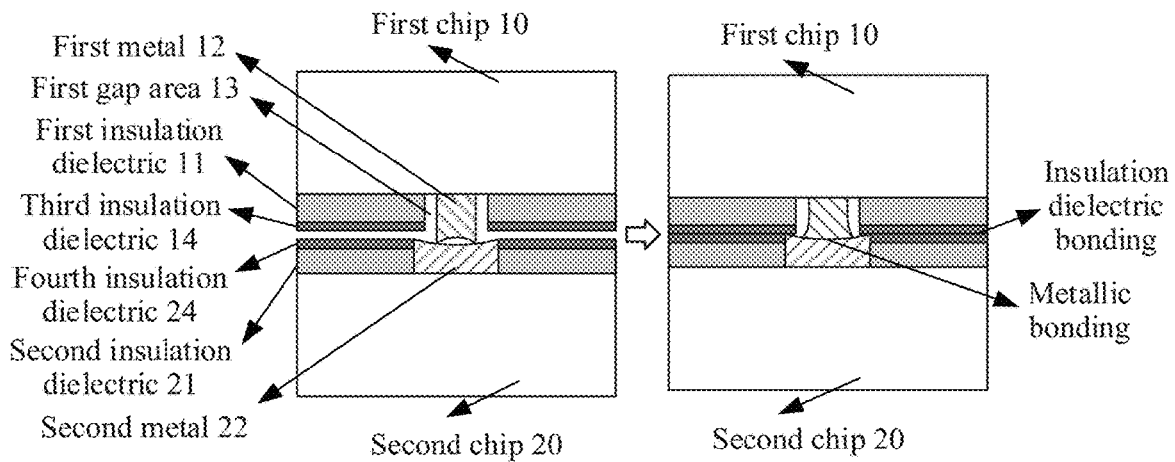
FIG. 12 is a schematic diagram of a cross section of still another hybrid bonding structure according to an embodiment of this application.

Refer to FIG. 12. FIG. 12 is a schematic diagram of a cross section of still another hybrid bonding structure according to this application. As shown in FIG. 12, a first chip 10 in an upper part and a second chip 20 in a lower part are connected. There are a first insulation dielectric 11, a first metal 12, and a third insulation dielectric 14 on a surface of the first chip 10. The third insulation dielectric 14 covers the first insulation dielectric 11. A surface of the first metal 12 is higher than a surface of the third insulation dielectric 14. There is a first gap area 13 between the first insulation dielectric 11 and the first metal 12 and between the third insulation dielectric 14 and the first metal 12. The first gap area 13 completely penetrates the first insulation dielectric 11 and the third insulation dielectric 14, to completely isolate the first insulation dielectric 11 and the third insulation dielectric 14 from the first metal 12. There are a second insulation dielectric 21, a second metal 22, and a fourth insulation dielectric 24 on a surface of the second chip 20. The fourth insulation dielectric 24 covers the second insulation dielectric 21. A surface of the second metal 22 is not higher than a surface of the fourth insulation dielectric 24. The second insulation dielectric 21 and the fourth insulation dielectric 24 are closely combined with the second metal 22. The first metal 12 and the second metal 22 are first in contact with each other to form metallic bonding. The first metal 12 is longitudinally and transversely deformed in the first gap area 13 under an appropriate external pressure provided by bonding tables, until the third insulation dielectric 14 and the fourth insulation dielectric 24 are in full contact with each other and form insulation dielectric bonding. Finally, a hybrid bonding structure of the metals and the insulation dielectrics is formed.

Optionally, the third insulation dielectric 14 may be one of silicon oxide, silicon nitride, silicon oxynitride, silicon carbonitride, aluminum oxide, amorphous silicon, silicon carbide, aluminum nitride, or the like, and the fourth insulation dielectric 24 may be one of silicon oxide, silicon nitride, silicon oxynitride, silicon carbonitride, aluminum oxide, amorphous silicon, silicon carbide, aluminum nitride, or the like.

Optionally, the third insulation dielectric 14 is the same as the fourth insulation dielectric 24. It may be understood that when the third insulation dielectric 14 is the same as the fourth insulation dielectric 24, bonding between the insulation dielectrics can be better implemented, and a process is relatively simple and is easy to implement. For example, the first insulation dielectric 11 is silicon oxide, the third insulation dielectric 14 is silicon nitride, the second insulation dielectric 21 is silicon oxide, and the fourth insulation dielectric 24 is silicon nitride.

Optionally, the surface of the second metal 22 may be lower than the surface of the fourth insulation dielectric 24 or a surface of the second insulation dielectric 21.

It should be understood that the surface of the first chip 10 or the surface of the second chip 20 may further include more layers of insulation dielectrics. This is not limited in this application.

Figure 13:
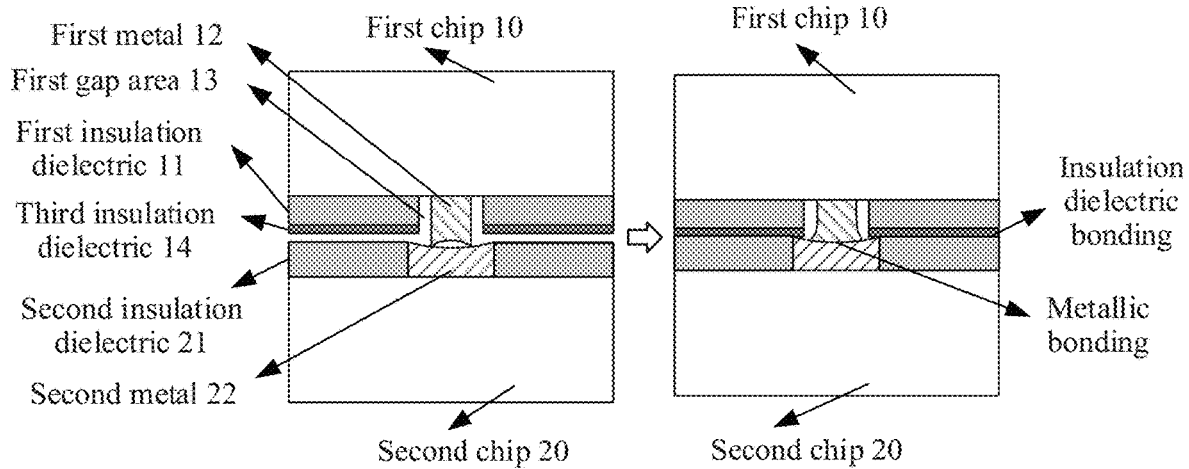
FIG. 13 is a schematic diagram of a cross section of still another hybrid bonding structure according to an embodiment of this application.

Optionally, the surface of the first chip 10 includes a plurality of layers of insulation dielectrics, for example, there are the first insulation dielectric 11 and the third insulation dielectric 14 on the surface of the first chip 10, and the third insulation dielectric 14 covers the first insulation dielectric 11. However, the surface of the second chip 20 includes only a single layer of insulation dielectric, for example, there is the second insulation dielectric 21 on the surface of the second chip 20. As shown in FIG. 13, the first gap area 13 completely penetrates the first insulation dielectric 11 and the third insulation dielectric 14. The first metal 12 and the second metal 22 are first in contact with each other to form metallic bonding. The first metal 12 is longitudinally and transversely deformed in the first gap area 13 under an appropriate external pressure provided by bonding tables, until the third insulation dielectric 14 and the second insulation dielectric 21 are in full contact with each other and form insulation dielectric bonding. Finally, a hybrid bonding structure of the metals and the insulation dielectrics is formed.

Figure 14:
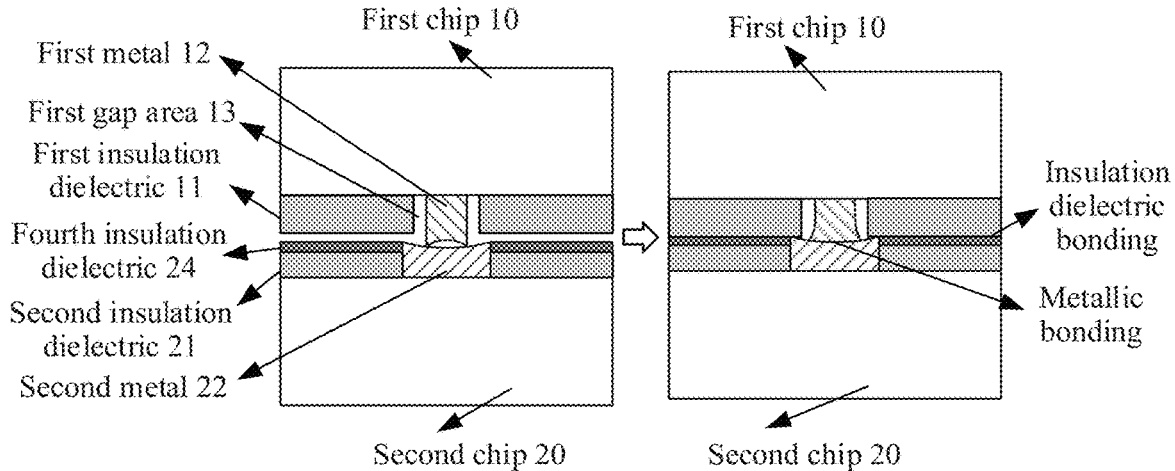
FIG. 14 is a schematic diagram of a cross section of still another hybrid bonding structure according to an embodiment of this application.

Optionally, the surface of the first chip 10 includes only a single layer of insulation dielectric, for example, there is the first insulation dielectric 11 on the surface of the first chip 10. However, the surface of the second chip 20 includes a plurality of layers of insulation dielectrics, for example, there are the second insulation dielectric 21 and the fourth insulation dielectric 24 on the surface of the second chip 20, and the fourth insulation dielectric 24 covers the second insulation dielectric 21. As shown in FIG. 14, the first gap area 13 completely penetrates the first insulation dielectric 11. The first metal 12 and the second metal 22 are first in contact with each other to form metallic bonding. The first metal 12 is longitudinally and transversely deformed in the first gap area 13 under an appropriate external pressure provided by bonding tables, until the first insulation dielectric 11 and the fourth insulation dielectric 24 are in full contact with each other and form insulation dielectric bonding. Finally, a hybrid bonding structure of the metals and the insulation dielectrics is formed.

It should be further understood that, except the foregoing distinguishing features, the other features of this embodiment may be completely the same as those of the embodiment 1. Refer to related descriptions in the embodiment 1. For brevity, details are not described herein again.

Embodiment 9

This embodiment is based on a same inventive concept as all the foregoing embodiments. A difference lies in that, in the embodiment 8, the first gap area 13 penetrates a plurality of layers of insulation dielectrics, for example, the first gap area 13 penetrates both the first insulation dielectric 11 and the third insulation dielectric 14, but in this embodiment, the first gap area 13 penetrates only one layer of insulation dielectric in a plurality of layers of insulation dielectrics on the surface of the first chip 10, for example, the first gap area 13 penetrates only the third insulation dielectric 14 on the surface of the first chip 10.

Figure 15:
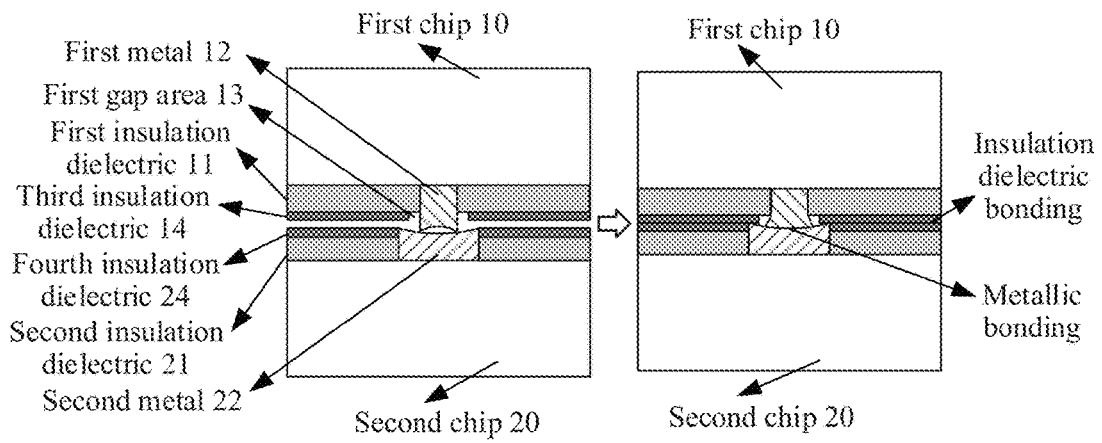
FIG. 15 is a schematic diagram of a cross section of still another hybrid bonding structure according to an embodiment of this application.

Refer to FIG. 15. FIG. 15 is a schematic diagram of a cross section of still another hybrid bonding structure according to this application. As shown in FIG. 15, a first chip 10 in an upper part and a second chip 20 in a lower part are connected. There are a first insulation dielectric 11, a first metal 12, and a third insulation dielectric 14 on a surface of the first chip 10. The third insulation dielectric 14 covers the first insulation dielectric 11. A surface of the first metal 12 is higher than a surface of the third insulation dielectric 14. The first insulation dielectric 11 is closely combined with the first metal 12. There is a first gap area 13 between the third insulation dielectric 14 and the first metal 12. The first gap area 13 completely penetrates the third insulation dielectric 14, to completely isolate the third insulation dielectric 14 from the first metal 12. There are a second insulation dielectric 21, a second metal 22, and a fourth insulation dielectric 24 on a surface of the second chip 20. The fourth insulation dielectric 24 covers the second insulation dielectric 21. A surface of the second metal 22 is not higher than a surface of the fourth insulation dielectric 24. The second insulation dielectric 21 and the fourth insulation dielectric 24 are closely combined with the second metal 22. The first metal 12 and the second metal 22 are first in contact with each other to form metallic bonding. The first metal 12 is longitudinally and transversely deformed in the first gap area 13 under an appropriate external pressure provided by bonding tables, until the third insulation dielectric 14 and the fourth insulation dielectric 24 are in full contact with each other and form insulation dielectric bonding. Finally, a hybrid bonding structure of the metals and the insulation dielectrics is formed.

Optionally, the third insulation dielectric 14 may be the same as the fourth insulation dielectric 24.

Optionally, the surface of the first chip 10 may further include more layers of insulation dielectrics. The surface of the second chip 20 may include only a single layer of insulation dielectric. For example, there may be only the second insulation dielectric 21 on the surface of the second chip 20.

It should be understood that, except the foregoing distinguishing features, the other features of this embodiment may be completely the same as those of the embodiment 8. Refer to related descriptions in the embodiment 8. For brevity, details are not described herein again.

Embodiment 10

This embodiment is based on a same inventive concept as all the foregoing embodiments. A difference lies in that, in the embodiment 8, the first gap area 13 is not filled with any substance, but in this embodiment, the first gap area 13 is filled with an organic polymer.

Figure 16:
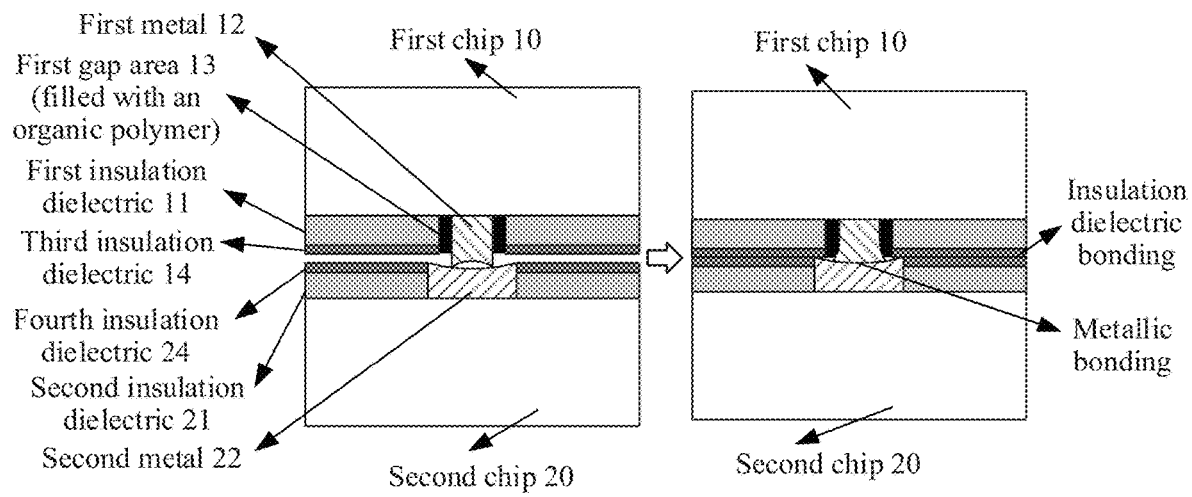
FIG. 16 is a schematic diagram of a cross section of still another hybrid bonding structure according to an embodiment of this application.

Refer to FIG. 16. FIG. 16 is a schematic diagram of a cross section of still another hybrid bonding structure according to this application. As shown in FIG. 16, a first chip 10 in an upper part and a second chip 20 in a lower part are connected. There are a first insulation dielectric 11, a first metal 12, and a third insulation dielectric 14 on a surface of the first chip 10. The third insulation dielectric 14 covers the first insulation dielectric 11. A surface of the first metal 12 is higher than a surface of the third insulation dielectric 14. There is a first gap area 13 between the first insulation dielectric 11 and the first metal 12 and between the third insulation dielectric 14 and the first metal 12. The first gap area 13 completely penetrates the first insulation dielectric 11 and the third insulation dielectric 14, to completely isolate the first insulation dielectric 11 and the third insulation dielectric 14 from the first metal 12. In addition, the first gap area 13 is filled with an organic polymer. There are a second insulation dielectric 21, a second metal 22, and a fourth insulation dielectric 24 on a surface of the second chip 20. The fourth insulation dielectric 24 covers the second insulation dielectric 21. A surface of the second metal 22 is not higher than a surface of the fourth insulation dielectric 24. The second insulation dielectric 21 and the fourth insulation dielectric 24 are closely combined with the second metal 22. The first metal 12 and the second metal 22 are first in contact with each other to form metallic bonding. The first metal 12 is longitudinally and transversely deformed in the first gap area 13 under an appropriate external pressure provided by bonding tables, until the third insulation dielectric 14 and the fourth insulation dielectric 24 are in full contact with each other and form insulation dielectric bonding. Finally, a hybrid bonding structure of the metals and the insulation dielectrics is formed.

Optionally, the organic polymer may be a macromolecular polymer, for example, synthetic rubber, synthetic fiber, polyethylene, or polyvinyl chloride.

It should be understood that although the first gap area 13 is filled with an organic polymer, because the organic polymer has good retractility and ductility, binding of the organic polymer to the first metal 12 is far less than binding of the first insulation dielectric 11 and the third insulation dielectric 14 to the first metal 12. Therefore, the first metal 12 may transversely extend in the first gap area that is filled with an organic polymer, to ensure that the third insulation dielectric 14 and the fourth insulation dielectric 24 can be in full contact with each other and form insulation dielectric bonding.

It should be further understood that, except that the first gap area 13 is filled with an organic polymer, the other features in this embodiment may be completely the same as those in the embodiment 8. Refer to related descriptions in the embodiment 8 and the embodiment 1. For brevity, details are not described herein again.

Embodiment 11

This embodiment is based on a same inventive concept as all the foregoing embodiments. A difference lies in that, in the embodiment 9, the cross section of the first metal 12 is rectangular, but in this embodiment, because the first metal 12 is obtained by processing by using a dual damascene process, the cross section of the first metal 12 is T-shaped.

Figure 17:
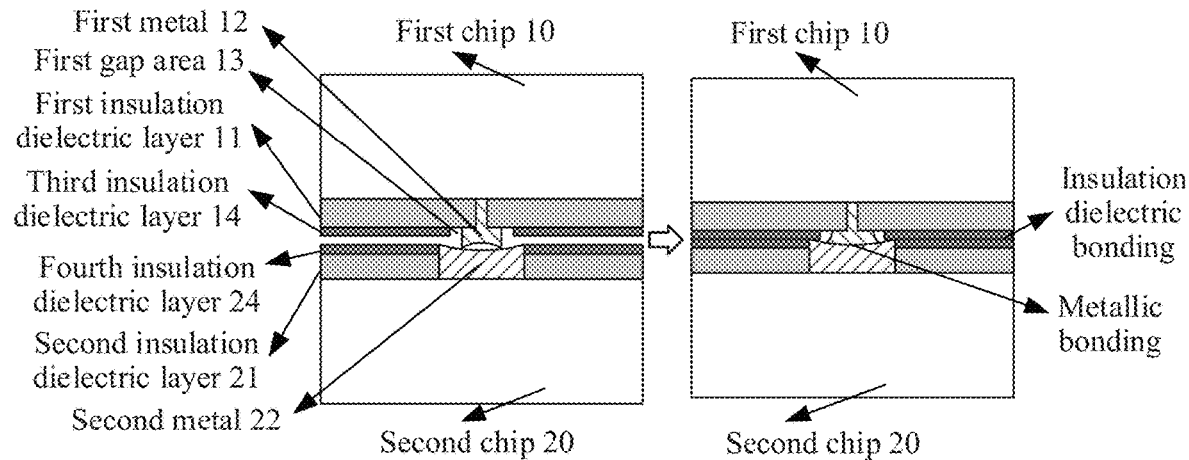
FIG. 17 is a schematic diagram of a cross section of still another hybrid bonding structure according to an embodiment of this application.

Refer to FIG. 17. FIG. 17 is a schematic diagram of a cross section of still another hybrid bonding structure according to this application. As shown in FIG. 17, a first chip 10 in an upper part and a second chip 20 in a lower part are connected. There are a first insulation dielectric 11, a first metal 12, and a third insulation dielectric 14 on a surface of the first chip 10. The third insulation dielectric 14 covers the first insulation dielectric 11. The first metal 12 is T-shaped. A surface of the first metal 12 is higher than a surface of the third insulation dielectric 14. The first insulation dielectric 11 is closely combined with the first metal 12. There is a first gap area 13 between the third insulation dielectric 14 and the first metal 12. The first gap area 13 completely penetrates the third insulation dielectric 14, to completely isolate the third insulation dielectric 14 from the first metal 12. There are a second insulation dielectric 21, a second metal 22, and a fourth insulation dielectric 24 on a surface of the second chip 20. The fourth insulation dielectric 24 covers the second insulation dielectric 21. A surface of the second metal 22 is not higher than a surface of the fourth insulation dielectric 24. The second insulation dielectric 21 and the fourth insulation dielectric 24 are closely combined with the second metal 22. The first metal 12 and the second metal 22 are first in contact with each other to form metallic bonding. The first metal 12 is longitudinally and transversely deformed in the first gap area 13 under an appropriate external pressure provided by bonding tables, until the third insulation dielectric 14 and the fourth insulation dielectric 24 are in full contact with each other and form insulation dielectric bonding. Finally, a hybrid bonding structure of the metals and the insulation dielectrics is formed.

It should be understood that a difference between this embodiment and the embodiment 9 lies only in that a processing technology of the first metal 12 is different, so that the shape of the cross section of the obtained first metal 12 is different. The other features may be completely consistent. Refer to related descriptions in the embodiment 9 and the embodiment 1. For brevity, details are not described herein again.

Embodiment 12

This embodiment is based on a same inventive concept as all the foregoing embodiments. A difference lies in that, in the embodiment 1, the cross section of the first metal 12 is rectangular, but in this embodiment, the cross section of the first metal 12 is inversely trapezoidal.

Figure 18:
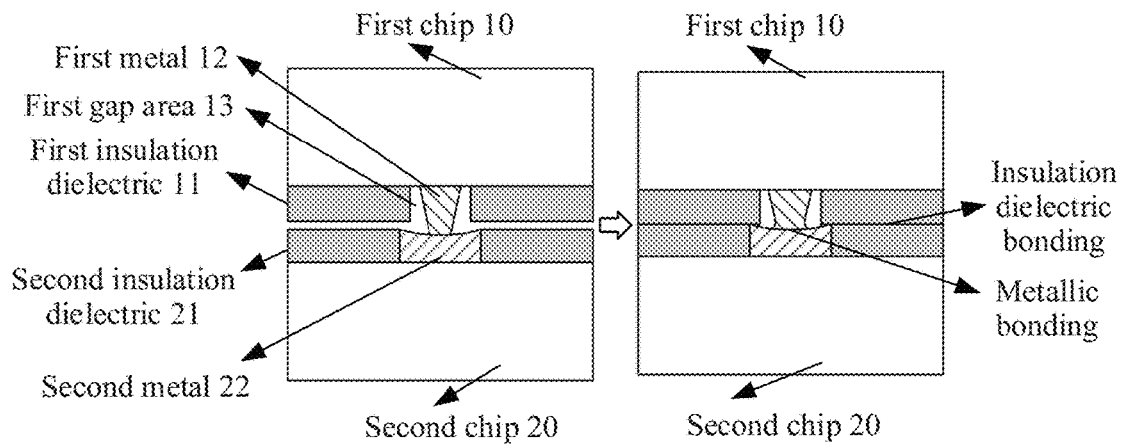
FIG. 18 is a schematic diagram of a cross section of still another hybrid bonding structure according to an embodiment of this application.

Refer to FIG. 18. FIG. 18 is a schematic diagram of a cross section of still another hybrid bonding structure according to this application. As shown in FIG. 18, a first chip 10 in an upper part and a second chip 20 in a lower part are connected. There are a first insulation dielectric 11 and a first metal 12 on a surface of the first chip 10. The first metal 12 is inversely trapezoidal. A surface of the first metal 12 is higher than a surface of the first insulation dielectric 11. There is a first gap area 13 between the first insulation dielectric 11 and the first metal 12. The first gap area 13 completely penetrates the first insulation dielectric 11, to completely isolate the first insulation dielectric 11 from the first metal 12. There are a second insulation dielectric 21 and a second metal 22 on a surface of the second chip 20. A surface of the second metal 22 is not higher than a surface of the second insulation dielectric 21. The second insulation dielectric 21 is closely combined with the second metal 22. The first metal 12 and the second metal 22 are first in contact with each other to form metallic bonding. The first metal 12 is longitudinally and transversely deformed in the first gap area 13 under an appropriate external pressure provided by bonding tables, until the first insulation dielectric 11 and the second insulation dielectric 21 are in full contact with each other and form insulation dielectric bonding. Finally, a hybrid bonding structure of the metals and the insulation dielectrics is formed.

Optionally, the first gap area 13 may be filled with an organic polymer. The organic polymer may be a macromolecular polymer, for example, synthetic rubber, synthetic fiber, polyethylene, or polyvinyl chloride.

Optionally, the surface of the first chip 10 and/or the surface of the second chip 20 may include a plurality of layers of insulation dielectrics. For example, there is further a fourth insulation dielectric 24 on the surface of the second chip 20, and the fourth insulation dielectric 24 covers the second insulation dielectric 21.

Optionally, the surface of the second metal 22 may be higher than the surface of the second insulation dielectric 21.

It should be understood that a difference between this embodiment and the embodiment 1 lies only in that the shape of the cross section of the first metal 12 is different. The other features may be completely consistent. Refer to related descriptions in the embodiment 1. For brevity, details are not described herein again.

It should be noted that all the foregoing described embodiments represent only some embodiments of this application. If there is no conflict, the technical solutions and the technical features in the foregoing embodiments may be combined with each other.

It should be further understood that the hybrid bonding structure provided in this application is a basic bonding structure, and any product or apparatus related to three-dimensional stacking may use the hybrid bonding structure provided in this application, for example, stacking of a plurality of layers of DRAMs, stacking of a DRAM and a logical chip, stacking of a static random-access memory (SRAM) and a logical chip, stacking of a plurality of layers of logical chips, stacking of an image sensor and an image signal processor, and the like.

Any hybrid bonding structure shown in FIG. 5 to FIG. 18 provides a first gap area 13, so that after the first metal 12 and the second metal 22 are first in contact with each other to form metallic bonding, the first metal 12 and/or the second metal 22 can be longitudinally and transversely deformed in the first gap area 13, to ensure that the first insulation dielectric 11 and the second insulation dielectric 21 can be in full contact with each other and form insulation dielectric bonding. This avoids a metallic bonding defect and a dielectric bonding defect, and improves a yield rate of mass production and long-term reliability of components.

Figure 19:
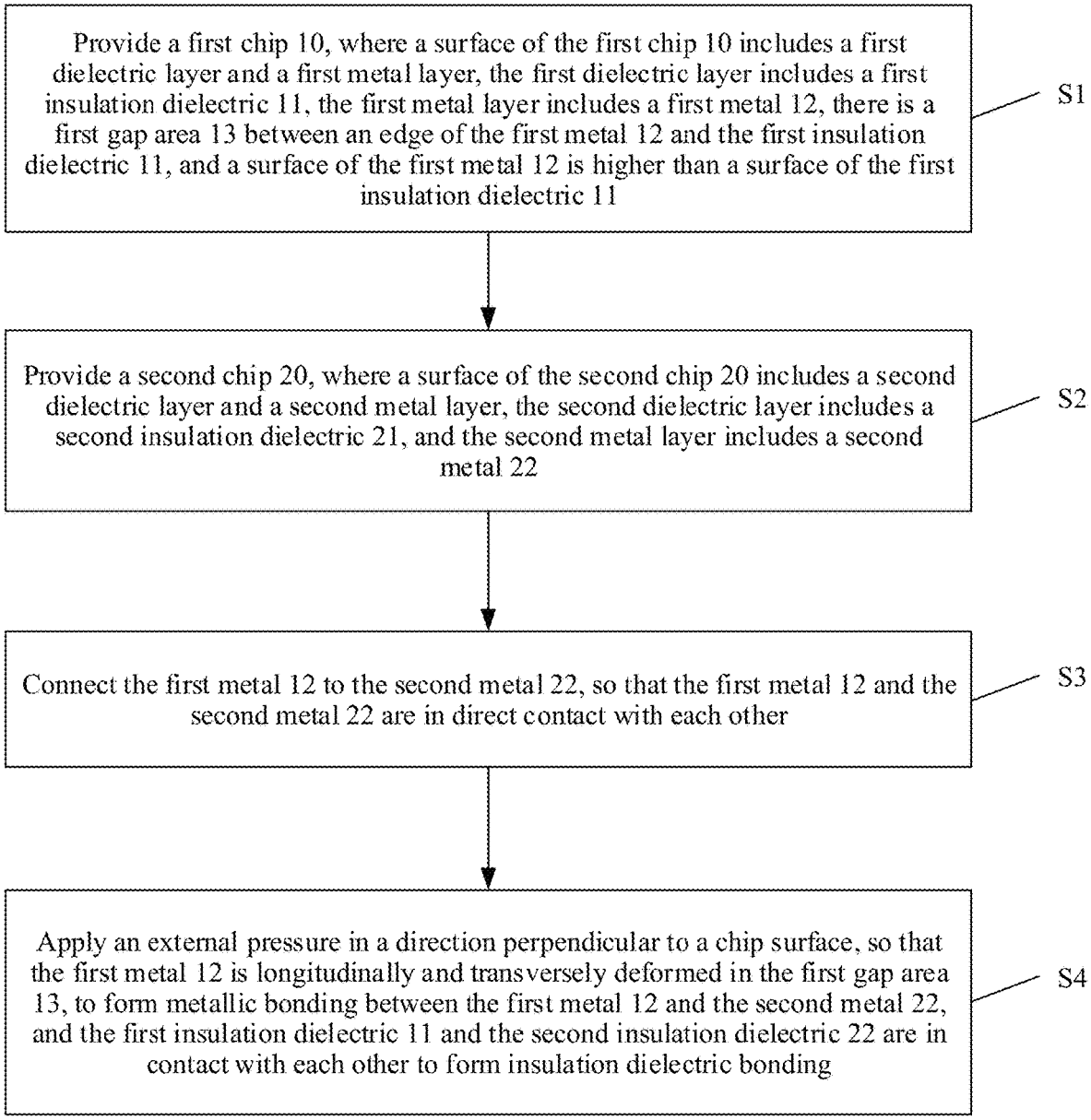
FIG. 19 is a schematic flowchart of a hybrid bonding method according to an embodiment of this application.

Refer to FIG. 19. FIG. 19 is a schematic flowchart of a hybrid bonding method according to an embodiment of this application. Refer to the hybrid bonding structures shown in FIG. 5 to FIG. 18 together. The hybrid bonding method may be executed by a bonding table, and includes some or all of the following steps:

Step S1: Provide a first chip 10. A surface of the first chip 10 includes a first dielectric layer and a first metal layer. The first dielectric layer includes a first insulation dielectric 11. The first metal layer includes a first metal 12. There is a first gap area 13 between an edge of the first metal 12 and the first insulation dielectric 11. A surface of the first metal 12 is higher than a surface of the first insulation dielectric 11.

Step S2: Provide a second chip 20. A surface of the second chip 20 includes a second dielectric layer and a second metal layer. The second dielectric layer includes a second insulation dielectric 21. The second metal layer includes a second metal 22.

Step S3: Connect the first metal 12 to the second metal 22, so that the first metal 12 and the second metal 22 are in direct contact with each other.

Step S4: Apply an external pressure in a direction perpendicular to a chip surface, so that the first metal 12 is longitudinally and transversely deformed in the first gap area 13, to form metallic bonding between the first metal 12 and the second metal 22, and the first insulation dielectric 11 and the second insulation dielectric 22 are in contact with each other to form insulation dielectric bonding.

Optionally, before the step S3, surface activation processing may be performed on the first chip 10 or the second chip 20. A processing method includes plasma surface processing, ion beam or atomic beam surface processing, or the like. This is not limited in this application.

Optionally, the step S3 may be performed in an environment of air, an inert atmosphere, a water vapor atmosphere, a low vacuum (for example, between 0.1 Pa and 100 Pa), or a high vacuum (for example, between $10^{-3}$ Pa and $10^{-7}$ Pa). This is not limited in this application.

Optionally, deformation of the first metal 12 in the first gap area 13 may be elastic deformation or plastic deformation. This is not limited in this application.

Optionally, the first chip 10 may include a through-silicon via, a through-molding via, a through-insulation dielectric via, or a through-glass via. Alternatively, the second chip 20 includes a through-silicon via, a through-molding via, a through-insulation dielectric via, or a through-glass via. Alternatively, the first chip 10 and the second chip 20 each include a through-silicon via, a through-molding via, a through-insulation dielectric via, or a through-glass via.

Optionally, there is a disc-shaped depression on the surface of first metal 12 and/or the surface of the second metal 22. The disc-shaped depression is caused by a CMP process. A height difference between the surface of the first metal 12 and the surface of the first insulation dielectric 11 is greater than a sum of a depth of the disc-shaped depression on the surface of the first metal 12 and a depth of the disc-shaped depression on the surface of the second metal 22.

Optionally, the first gap area 13 may be formed by performing dry etching on the first insulation dielectric 11 or the first metal 12, or may be formed by performing wet etching on the first insulation dielectric 11 or the first metal 12.

Optionally, a width range of the first gap area 13 is between 10 nanometers and 1,000 nanometers. It may be understood that an excessively narrow width of the first gap area 13 may limit transverse deformation of the first metal 12, and this causes a bonding defect when the first insulation dielectric 11 and the second insulation dielectric 21 are bonded. An excessively wide width of the first gap area 13 causes a waste of an area of an insulation dielectric bonding area on the surface of the first chip 10.

Optionally, a cross section of the first metal 12 and/or the second metal 22 may be rectangular, square, regularly trapezoidal, inversely trapezoidal, conical, or T-shaped. A processing technology of the first metal 12 or the second metal 22 and the shape of the cross section are not limited in this application.

Optionally, the first insulation dielectric 11 may be one of silicon oxide, silicon nitride, silicon oxynitride, silicon carbonitride, aluminum oxide, amorphous silicon, silicon carbide, aluminum nitride, or the like. The second insulation dielectric 21 may be one of silicon oxide, silicon nitride, silicon oxynitride, silicon carbonitride, aluminum oxide, amorphous silicon, silicon carbide, aluminum nitride, or the like. The first metal 12 may be one of or an alloy formed by more of copper, gold, silver, aluminum, nickel, tungsten, titanium, tin, conductive graphene, or a carbon nanotube. The second metal 22 may be one of or an alloy formed by more of copper, gold, silver, aluminum, nickel, tungsten, titanium, tin, conductive graphene, or a carbon nanotube.

Optionally, the first insulation dielectric 11 is the same as the second insulation dielectric 21, and the first metal 21 is the same as the second metal 22. It may be understood that when the first insulation dielectric 11 is the same as the second insulation dielectric 21, bonding between the insulation dielectrics can be better implemented, and a process is relatively simple and is easy to implement. Likewise, when the first metal 12 is the same as the second metal 22, bonding between the metals can be better implemented, and a process is relatively simple and is easy to implement.

In an embodiment of this application, with reference to FIG. 8 and FIG. 9, the surface of the second metal 22 is higher than the surface of the second insulation dielectric 21. The second metal 22 may be longitudinally and transversely deformed in the first gap area 13.

Optionally, a height difference between the surface of the second metal 22 and the surface of the second insulation dielectric 21 is greater than the sum of the depth of the disc-shaped depression on the surface of the first metal 12 and the depth of the disc-shaped depression on the surface of the second metal 22.

In an embodiment of this application, with reference to FIG. 11, there is a second gap area 23 between an edge of the second metal 22 and the second insulation dielectric 21.

Optionally, a width range of the second gap area 23 is between 10 nanometers and 1,000 nanometers.

Optionally, the second gap area 23 is filled with an organic polymer. The organic polymer may be a macromolecular polymer, for example, synthetic rubber, synthetic fiber, polyethylene, or polyvinyl chloride.

In an embodiment of this application, with reference to FIG. 12, FIG. 15, FIG. 16, and FIG. 17, the first dielectric layer on the surface of the first chip 10 further includes a third insulation dielectric 14, and the third insulation dielectric 14 covers the first insulation dielectric 11. There is a first gap area 13 between an edge of the first metal 12 and the third insulation dielectric 14.

Optionally, the third insulation dielectric 14 may be one of silicon oxide, silicon nitride, silicon oxynitride, silicon carbonitride, aluminum oxide, amorphous silicon, silicon carbide, aluminum nitride, or the like.

Optionally, the first gap area 13 is filled with an organic polymer. The organic polymer may be a macromolecular polymer, for example, synthetic rubber, synthetic fiber, polyethylene, or polyvinyl chloride.

It should be noted that, the hybrid bonding method provided in this application may be specifically implemented with reference to related descriptions of the hybrid bonding structures shown in FIG. 5 to FIG. 18. Details are not described herein again.

The foregoing hybrid bonding method is applied to a hybrid bonding structure, for example, hybrid bonding of between wafers, hybrid bonding between a wafer and a chip, or hybrid bonding between chips. When the method is applied to the hybrid bonding between chips, for example, hybrid bonding is performed between the first chip 10 and the second chip 20, after the first metal 12 and the second metal 22 are first in contact with each other to form metallic bonding, the first metal 12 and/or the second metal 22 are/is longitudinally and transversely deformed in the first gap area 13, to ensure that the first insulation dielectric 11 and the second insulation dielectric 21 can be in full contact with each other and form insulation dielectric bonding. This avoids a metallic bonding defect and a dielectric bonding defect, and improves a yield rate of mass production and long-term reliability of components.

It should be noted that the foregoing different embodiments may be cross-referenced. For example, when technical details of an aspect are briefly described in an embodiment, reference may be further made to descriptions in other embodiments.

It should be understood that sequence numbers of the foregoing processes do not mean execution sequences in various embodiments of this application. The execution sequences of the processes should be determined based on functions and internal logic of the processes, and should not be construed as any limitation on the implementation processes of the embodiments of this application.

It should be further understood that the foregoing embodiments of the hybrid bonding method may be executed by using a robot or a numerical control processing manner, and device software or a process configured to execute the hybrid bonding method may execute the foregoing hybrid bonding method by executing computer program code stored in a memory.

The foregoing descriptions are only specific implementations of the present disclosure, but are not intended to limit the protection scope of the present disclosure. Any variation or replacement readily figured out by a person skilled in the art within the technical scope disclosed in the present disclosure shall fall within the protection scope of the present disclosure. Therefore, the protection scope of the present disclosure shall be subject to the protection scope of the claims.

What is claimed is:

1. A hybrid bonding structure, comprising:
   a first chip; and
   a second chip, wherein
   a surface of the first chip includes a first dielectric layer and a first metal layer, the first dielectric layer includes a first insulation dielectric, the first metal layer includes a first metal, and a first gap area exists between an edge of the first metal and the first insulation dielectric;
   a surface of the second chip includes a second dielectric layer and a second metal layer, the second dielectric layer includes a second insulation dielectric, and the second metal layer includes a second metal;
   a surface of the first metal is higher than a surface of the first insulation dielectric;
   metallic bonding is formed after the first metal is in contact with the second metal, and the first metal is longitudinally and transversely deformed in the first gap area, and
   insulation dielectric bonding is formed after the first insulation dielectric is in contact with the second insulation dielectric.

2. The hybrid bonding structure according to claim 1, wherein a surface of the second metal is higher than a surface of the second insulation dielectric.

3. The hybrid bonding structure according to claim 1, wherein a disc-shaped depression exists on the surface of the first metal and/or the surface of the second metal.

4. The hybrid bonding structure according to claim 3, wherein a height difference between the surface of the first metal and the surface of the first insulation dielectric is greater than a sum of a depth of the disc-shaped depression on the surface of the first metal and a depth of the disc-shaped depression on the surface of the second metal.

5. The hybrid bonding structure according to claim 4, wherein the height difference is used to ensure that the metallic bonding is formed before the insulation dielectric bonding in a bonding process.

6. The hybrid bonding structure according to claim 1, wherein a second gap area exists between an edge of the second metal and the second insulation dielectric.

7. The hybrid bonding structure according to claim 6, wherein a width range of the first gap area and/or the second gap area is between 10 nanometers and 1,000 nanometers.

8. The hybrid bonding structure according to claim 1, wherein the first dielectric layer further comprises a third insulation dielectric, and the first gap area exists between the edge of the first metal and the third insulation dielectric.

9. The hybrid bonding structure according to claim 1, wherein the first gap area is filled with an organic polymer.

10. The hybrid bonding structure according to claim 8, wherein the first insulation dielectric is one of silicon oxide, silicon nitride, silicon oxynitride, silicon carbonitride, aluminum oxide, amorphous silicon, silicon carbide, or aluminum nitride, the second insulation dielectric is one of silicon oxide, silicon nitride, silicon oxynitride, silicon carbonitride, aluminum oxide, amorphous silicon, silicon carbide, or aluminum nitride, the first metal is one of copper, gold, silver, aluminum, nickel, tungsten, titanium, tin, conductive graphene, or a carbon nanotube, the second metal is one of copper, gold, silver, aluminum, nickel, tungsten, titanium, tin, conductive graphene, or a carbon nanotube; and the third insulation dielectric is one of silicon nitride, silicon carbonitride, aluminum oxide, amorphous silicon, silicon carbide, or aluminum nitride.

11. The hybrid bonding structure according to claim 10, wherein the first insulation dielectric is same as the second insulation dielectric, and the first metal is same as the second metal.

12. The hybrid bonding structure according to claim 1, wherein a cross section of the first metal and/or the second metal is rectangular, square, regularly trapezoidal, inversely trapezoidal, conical, or T-shaped.

13. A hybrid bonding method, comprising:
providing a first chip, wherein a surface of the first chip includes a first dielectric layer and a first metal layer, the first dielectric layer includes a first insulation dielectric, the first metal layer includes a first metal, a first gap area exists between an edge of the first metal and the first insulation dielectric, and a surface of the first metal is higher than a surface of the first insulation dielectric; and
providing a second chip, wherein a surface of the second chip includes a second dielectric layer and a second metal layer, the second dielectric layer includes a second insulation dielectric, and the second metal layer includes a second metal;
forming metallic bonding after the first metal is in contact with the second metal; and
longitudinally and transversely deforming the first metal in the first gap area, to form insulation dielectric bonding after the first insulation dielectric is in contact with the second insulation dielectric.

14. The method according to claim 13, wherein a surface of the second metal is higher than a surface of the second insulation dielectric.

15. The method according to claim 13, wherein a disc-shaped depression exists on the surface of the first metal and/or the surface of the second metal, wherein a height difference between the surface of the first metal and the surface of the first insulation dielectric is greater than a sum of a depth of the disc-shaped depression on the surface of the first metal and a depth of the disc-shaped depression on the surface of the second metal.

16. The method according to claim 13, wherein a second gap area exists between an edge of the second metal and the second insulation dielectric, wherein a width range of the first gap area and/or the second gap area is between 10 nanometers and 1,000 nanometers.

17. The method according to claim 13, wherein the first dielectric layer further comprises a third insulation dielectric, and the first gap area exists between the edge of the first metal and the third insulation dielectric.

18. The method according to claim 13, wherein the first gap area is filled with an organic polymer.

19. The method according to claim 16, wherein the first insulation dielectric is one of silicon oxide, silicon nitride, silicon oxynitride, silicon carbonitride, aluminum oxide, amorphous silicon, silicon carbide, or aluminum nitride, the second insulation dielectric is one of silicon oxide, silicon nitride, silicon oxynitride, silicon carbonitride, aluminum oxide, amorphous silicon, silicon carbide, or aluminum nitride, the first metal is one of copper, gold, silver, aluminum, nickel, tungsten, titanium, tin, conductive graphene, or a carbon nanotube, the second metal is one of copper, gold, silver, aluminum, nickel, tungsten, titanium, tin, conductive graphene, or a carbon nanotube, and the third insulation dielectric is one of silicon nitride, silicon carbonitride, aluminum oxide, amorphous silicon, silicon carbide, or aluminum nitride.

20. The method according to claim 18, wherein the first insulation dielectric is same as the second insulation dielectric, and the first metal is same as the second metal.

* * * * *